US012563724B2

(12) United States Patent
Suthram et al.

(10) Patent No.: US 12,563,724 B2
(45) Date of Patent: Feb. 24, 2026

(54) TWO TRANSISTOR MEMORY CELLS WITH SOURCE-DRAIN COUPLING IN ONE TRANSISTOR

(71) Applicant: Intel Corporation, Santa Clara, CA (US)

(72) Inventors: Sagar Suthram, Portland, OR (US); Abhishek A. Sharma, Hillsboro, OR (US); Wilfred Gomes, Portland, OR (US); Anand S. Murthy, Portland, OR (US); Tahir Ghani, Portland, OR (US); Pushkar Sharad Ranade, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 738 days.

(21) Appl. No.: 17/843,867

(22) Filed: Jun. 17, 2022

(65) Prior Publication Data

US 2023/0413547 A1     Dec. 21, 2023

(51) Int. Cl.
H10B 41/70         (2023.01)
H10B 41/35         (2023.01)
(52) U.S. Cl.
CPC ............. H10B 41/70 (2023.02); H10B 41/35 (2023.02)

(58) Field of Classification Search
CPC ........ H10B 41/70; H10B 41/35; H10B 12/00; H10D 30/62; H10D 89/10
See application file for complete search history.

(56) References Cited

U.S. PATENT DOCUMENTS

| | | | |
|---|---|---|---|
| 10,090,059 B2 * | 10/2018 | Kim ....................... | G11C 17/18 |
| 10,629,752 B1 * | 4/2020 | Teo ....................... | H10D 62/122 |
| 11,930,636 B2 * | 3/2024 | Wieduwilt ............. | H10B 20/25 |
| 2023/0395676 A1 * | 12/2023 | Suthram .............. | H10D 62/118 |

* cited by examiner

*Primary Examiner* — Allison Bernstein
(74) *Attorney, Agent, or Firm* — Akona IP PC

(57)         ABSTRACT

IC devices implementing 2T memory cells with source-drain coupling in one transistor, and related assemblies and methods, are disclosed herein. In particular, 2T memory cells presented herein use first and second transistors arranged so that source and drain terminals of the second transistor are coupled to one another. A memory state may be represented by charge indicative of the bit value stored in the second transistor, while the first transistor may serve as a switch to control access to the second transistor. 2T memory cells with source-drain coupling in one transistor provide a promising way to increasing memory cell densities, drive current, and design flexibility in making electrical connections to, or between, various transistor terminals and control lines of memory arrays, thus providing good scalability in the number of 2T memory cells included in memory arrays.

20 Claims, 12 Drawing Sheets

2400

PROCESSING DEVICE 2402

MEMORY 2404

COMMUNICATION CHIP 2406

ANTENNA 2408

BATTERY/POWER CIRCUITRY 2410

DISPLAY DEVICE 2412

AUDIO OUTPUT DEVICE 2414

AUDIO INPUT DEVICE 2416

OTHER OUTPUT DEVICE 2418

OTHER INPUT DEVICE 2420

GPS DEVICE 2422

SECURITY INTERFACE DEVICE 2424

TEMPERATURE DETECTION DEVICE 2426

TEMPERATURE REGULATION DEVICE 2428

TWO TRANSISTOR MEMORY CELLS WITH SOURCE-DRAIN COUPLING IN ONE TRANSISTOR

BACKGROUND

Memory is important to the performance of modern system-on-a-chip (SoC) technology. Low-power and high-density memory is used in many different computer products and further improvements are always desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
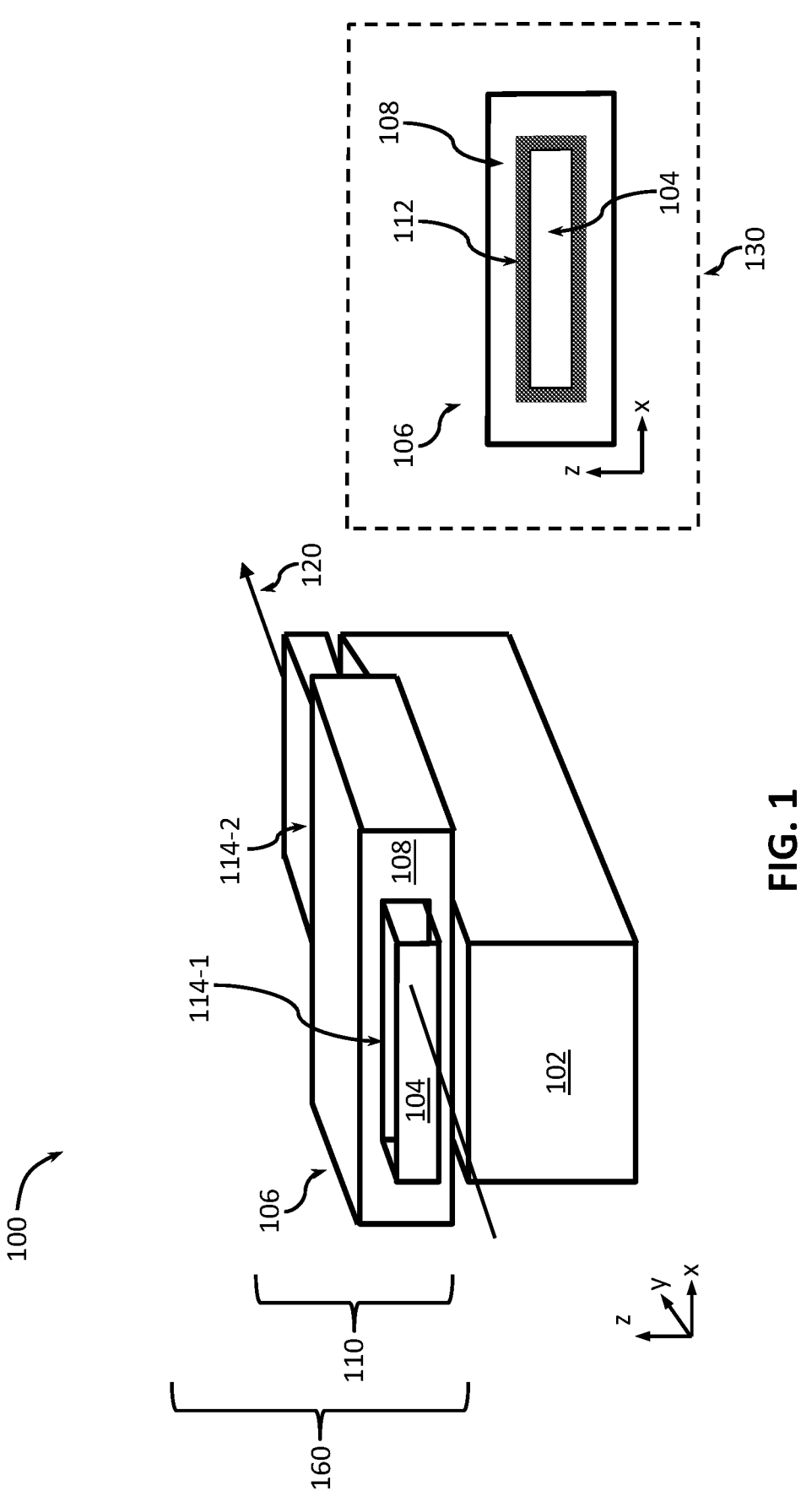
FIG. 1 provides a perspective view of an example integrated circuit (IC) device implementing a nanoribbon transistor, in accordance with some embodiments.

IC devices implementing 2T memory cells with source-drain coupling in one transistor, and related assemblies and methods, are disclosed herein. The devices, assemblies, and methods of this disclosure each have several innovative aspects, no single one of which is solely responsible for all the desirable attributes disclosed herein. Details of one or more implementations of the subject matter described in this specification are set forth in the description below and the accompanying drawings.

As the name suggests, a 2T memory cell includes two transistors. Each transistor may be a field-effect transistor (FET), e.g., a metal-oxide-semiconductor FET (MOSFET), having a source terminal, a drain terminal, and a gate terminal. A FET typically includes a semiconductor channel material, a source region and a drain region provided in the channel material, and a gate that includes at least a gate electrode material and, optionally, may also include a gate insulator. In such a transistor, the gate is provided over a portion of the channel material between the source region and the drain region. The term "source terminal" typically refers to either the source region or a contact to the source region, the term "drain terminal" terminal" typically refers to either the drain region or a contact to the drain region, and the term "gate terminal" typically refers to either the gate or a contact to the gate. Since, as is common in the field of FETs, designations of "source" and "drain" are often interchangeable, source and drain regions/contacts/terminals of a transistor may be referred to as first and second source or drain (S/D) regions/contacts/terminals, where, in some embodiments, the first S/D region/contact/terminal is a source region/contact/terminal and the second S/D region/contact/terminal is a drain region/contact/terminal and, in other embodiments, this designation of source and drain is reversed.

2T memory cells have been explored in the past. One type of 2T memory cell explored in the past includes first and second transistors referred to as, respectively, a "write transistor" and a "read transistor." In such a 2T memory cell, the first S/D terminal of the write transistor is coupled to a gate terminal of the read transistor, the second S/D terminal of the write transistor is coupled to a write bitline (WBL), the gate terminal of the write transistor is coupled to a write wordline (WWL), the first S/D terminal of the read transistor is coupled to a read wordline (RWL), and the second S/D terminal of the read transistor is coupled to a read bitline (RBL).

Embodiments of the present disclosure provide various alternative arrangements of 2T memory cells and corresponding memory control lines (which may also be referred to, simply, as "control lines"). All embodiments are based on using first and second transistors arranged so that source and drain terminals of the second transistor are coupled to one another. Hence, various 2T memory cells presented herein are referred to as "2T memory cells with source-drain coupling in one transistor," to reflect this coupling between source and drain terminals of the second transistor. In one aspect of the present disclosure, first and second transistors of a 2T memory cell with source-drain coupling in one transistor are arranged so that first S/D terminals of these transistors are coupled to one another, a second S/D terminal of the first transistor is coupled to a first control line, a gate terminal of the first transistor is coupled to a second control line, a gate terminal of the second transistor is coupled to a third control line, and a second S/D terminal of the second transistor is coupled to a first S/D terminal of the second transistor and, therefore, also coupled to a first S/D terminal of the first transistor. In another aspect of the present disclosure, first and second transistors of a 2T memory cell with source-drain coupling in one transistor are arranged so that a first S/D terminal of the first transistor and a gate terminal of the second transistor are coupled to one another, a second S/D terminal of the first transistor is coupled to a first control line, a gate terminal of the first transistor is coupled to a second control line, and first and second S/D terminals of the second transistor are coupled one another and to a third control line. In such memory cells, a memory state, or a bit value (e.g., logical "1" or "0") may be represented by charge indicative of the bit value, stored in either intentional or parasitic capacitance in the second transistor. On the other hand, the first transistor may serve as a switch to control access (in terms of read and write operations) to the second transistor. For example, applying a certain voltage to the gate terminal of the first transistor (by virtue of applying the voltage to the first control line coupled to said gate terminal) may enable current flow between first and second S/D terminals of the first transistors, which may allow either programming a memory state on the second transistor (i.e., performing a write operation) or reading/ sensing a memory state stored on the second transistor (i.e., performing a read operation). The second and third control lines may be used to control reading or writing of the memory states on the second transistor. For ease of explanations, in the following, the first transistor is referred to as an "access transistor" and the second transistor is referred to as a "storage transistor." Furthermore, the first control line is referred to in the following as a "bitline" (BL), the second control line is referred to as a "wordline" (WL), and the third control line is referred to as a "plateline" (PL).

2T memory cells with source-drain coupling in one transistor provide a promising way to increasing memory cell densities, drive current, and design flexibility in making electrical connections to, or between, various transistor terminals and control lines of memory arrays, thus providing good scalability in the number of 2T memory cells included in memory arrays. For example, since such memory cells can be fabricated with as little as two transistors, they can provide higher density and lower standby power versus other types of memory in the same process technology. Furthermore, embodiments of the present disclosure are further based on recognition that IC devices implementing 2T memory cells with source-drain coupling in one transistor may be optimized even further if transistors are to be operated at relatively low temperatures, where, as used herein, low-temperature operation (or "lower-temperature" operation) refers to operation at temperatures below room temperature, e.g., below 200 Kelvin degrees or lower. Thermal energy is much lower at low temperatures and, consequently, the leakage of a transistor is much lower, compared to room temperature operation. Consequently, if a storage transistor is operated at low temperatures, it may be able to store the memory state longer than what can be achieved at room temperatures.

In the following detailed description, various aspects of the illustrative implementations may be described using terms commonly employed by those skilled in the art to convey the substance of their work to others skilled in the art. For example, in context of describing various terminals of the access and storage transistors of 2T memory cells as being coupled to one another and/or to any of the control lines described herein, the term "coupled" means an electrical connection, e.g., a direct electrical connection between the things that are coupled, by means of an interconnect (e.g., an electrically conductive via, line, or wire). In another example, the term "circuit" means one or more passive and/or active components that are arranged to cooperate with one another to provide a desired function. Furthermore, if used, the terms "oxide," "carbide," "nitride," "sulfide," etc. refer to compounds containing, respectively, oxygen, carbon, nitrogen, sulfur, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20%, e.g., within +/−5% or within +/−2%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−8% of a target value, e.g., within +/−5% of a target value or within +/−2% of a target value, based on the context of a particular value as described herein or as known in the art.

The term "interconnect" may refer to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "metal traces," "lines," "metal lines," "wires," "metal wires," "trenches," or "metal trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PIC. In such cases, the term "interconnect" may refer to optical waveguides (e.g., structures that guide and confine light waves), including optical fiber, optical splitters, optical combiners, optical couplers, and optical vias. The term "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

The terms "over," "under," "between," and "on" as used herein refer to a relative spatial position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, analogous elements designated in the present drawings with different reference numerals after a dash. For example, transistors 310-1 and 310-2 may be collectively referred to together without the reference numerals after the dash, e.g., as "transistors 310." In order to not clutter the drawings, if multiple instances of certain elements are illustrated in a given drawing, only some of the elements may be labeled with a reference sign. A plurality of drawings with the same number and different letters may be referred to without the letters, e.g., FIGS. 4A-4B may be referred to as "FIG. 4."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using, e.g., Physical Failure Analysis (PFA) would allow determination of presence of 2T memory cells with source-drain coupling in one transistor as described herein.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices implementing 2T memory cells with source-drain coupling in one transistor as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

In general, 2T memory cells with source-drain coupling in one transistor may be implemented using transistors of any architecture, such as planar transistors. Recently, transistors with non-planar architectures, such as FinFETs (also sometimes referred to as "wrap around gate transistors" or "tri-gate transistors") and nanoribbon/nanowire transistors (also sometimes referred to as "gate all-around (GAA) transistors"), have been explored intensively as they may provide advantages compared to planar transistors.

In a FinFET, an elongated semiconductor structure (e.g., an elongated structure that includes one or more semiconductor materials) shaped as a fin extends away from a base (e.g., from a semiconductor substrate or any suitable support structure). A portion of a fin that is closest to the base may be enclosed by an insulator material. Such an insulator material, typically an oxide, is commonly referred to as a "shallow trench isolation" (STI), and the portion of the fin enclosed by the STI is referred to as a "subfin portion" or simply a "subfin." A gate stack may wrap around an upper portion of the fin (e.g., the portion farthest away from the base). The portion of the fin around which the gate stack wraps is referred to as a "channel region" (or, alternatively, as a "channel portion" or simply a "channel") of a FinFET. A semiconductor material of the channel region is commonly referred to as a "channel material" of the transistor. FinFETs are sometimes referred to as "tri-gate transistors" because, in use, such transistors may form conducting channels on three "sides" of the channel region of the fin. A source region and a drain region are provided in the fin on the opposite sides of the gate stack, forming, respectively, a source and a drain of a FinFET.

In a nanoribbon transistor, a gate stack may be provided around a portion of an elongated semiconductor structure called "nanoribbon", forming a gate on all sides of the nanoribbon. The "channel" or the "channel region" of a nanoribbon transistor is the portion of the nanoribbon around which the gate stack wraps. Such transistors are sometimes referred to as "GAA transistors" because, in use, such transistors may form conducting channels on all "sides" of the channel region of the nanoribbon. A source region and a drain region are provided in the nanoribbon on each side of the gate stack, forming, respectively, a source and a drain of a nanoribbon transistor. In some settings, the term "nanoribbon" has been used to describe an elongated semiconductor structure that has a substantially rectangular transverse cross-section (e.g., a cross-section in a plane perpendicular to the longitudinal axis of the structure), while the term "nanowire" has been used to describe a similar structure but with a substantially circular or square transverse cross-sections. In the following, a single term "nanoribbon transistor" is used to describe all non-planar transistors where a gate stack wraps around substantially all sides of an elongated semiconductor structure, independent of the shape of the transverse cross-section. Thus, as used herein, the term "nanoribbon transistor" is used to cover transistors with elongated semiconductor structures that have substantially rectangular transverse cross-sections (possibly with rounded corners), transistors with elongated semiconductor structures that have substantially square transverse cross-sections (possibly with rounded corners), transistors with elongated semiconductor structures that have substantially circular or elliptical/oval transverse cross-sections, as well as transistors with elongated semiconductor structures that have any polygonal transverse cross-sections.

As the foregoing illustrates, both FinFETs and nanoribbon transistors are built based on elongated semiconductor structures (in the following referred to, simply, as "elongated structures"), e.g., fins or nanoribbons, respectively. A longitudinal axis of such an elongated structures may be defined as an axis that includes a line along the direction of carrier transport between source and drain regions of the transistor. Typically, such an axis is substantially parallel to the support structure on/in which a transistor resides and is one of lines of symmetry for the elongated structure of the transistor (at least for the idealized version of the transistor that does not reflect unintended manufacturing variations that may affect the real-life geometry of the transistor). Conventionally, FinFETs and nanoribbon transistors are oriented on a support structure so that the direction of their carrier transport, represented, e.g., by the longitudinal axes of their elongated structures (e.g., fins or nanoribbons, respectively), is parallel to the front and back sides/planes of the support structure and is either perpendicular or parallel to different edges of the support structure, in particular, being either perpendicular or parallel to different edges of the front side or the back side of the support structure. The gates of such transistors are then oriented so that an angle between a projection of a gate of a given transistor onto a plane of the support structure and a projection of the longitudinal axis of an elongated structure onto said plane is 90 degrees (e.g., the gates extend in directions perpendicular to longitudinal axes of elongated structures).

In contrast to such conventional implementations, in some embodiments of the present disclosure, 2T memory cells with source-drain coupling in one transistor may be implemented using angled transistors. As used herein, a transistor is referred to as an "angled transistor" if the direction of carrier transport of the transistor is neither perpendicular nor parallel to any edges of the front side or the back side of a support structure (e.g., a die) over which the transistor is implemented. In other words, a transistor is referred to as an "angled transistor" if an angle between a projection of the elongated structure of the transistor onto a plane of the support structure and one or more of the edges of the support structure is neither 0 degrees, no 90 degrees, e.g., between about 10 degrees and 80 degrees. For example, FinFETs and nanoribbon transistors are "angled transistors" if, along their length, the fins of the FinFETs and the nanoribbons of the nanoribbon transistors are oriented at an angle between about 10 and 80 degrees (e.g., slanted) with respect to the edges of the support structure on which they are implemented. Since, in geometry, not just one but two angles may be defined among any two lines crossing one another when the angles are defined as measured clockwise or counterclockwise with respect to one of the lines, the two such angles adding together to be 180 degrees, for the angled transistors described herein the angles refer to the smaller of the two angles. When a transistor is implemented as an angled transistor, the gate of the transistor may still be aligned with the edges of the support structure (e.g., be either perpendicular or parallel to the support structure), which means that the gate is non-angled with respect to the edges of the support structure but is angled with respect to the direction of carrier transport of the transistor. Alternatively, the gate of the transistor may also be angled with respect to the edges of the support structure, as long as it remains angled (e.g., not perpendicular) with respect to the direction of carrier transport of the transistor.

Angling any of the access and storage transistors of a memory array implementing 2T memory cells with source-drain coupling in one transistor allows realizing more efficient electrical connectivity between various transistors terminals and control lines (e.g., bitlines, wordlines, etc.). Furthermore, implementing transistors as angled transistors means that, for a given width of an elongated structure of the transistor, the effective cross-section over which the carriers may be transported between source and drain is increased (e.g., the cross-section of the gates in the x-z plane of the example coordinate system illustrated in the present drawings), advantageously resulting in an increased drive current. Conversely, implementing transistors as angled transistors with gates that are angled with respect to the direction of carrier transport of the transistors may advantageously allow reducing the widths of the elongated structures of the transistors, thus reducing the footprints of transistors, while keeping the drive current substantially matched to what it would have been without angling.

Figure 6:
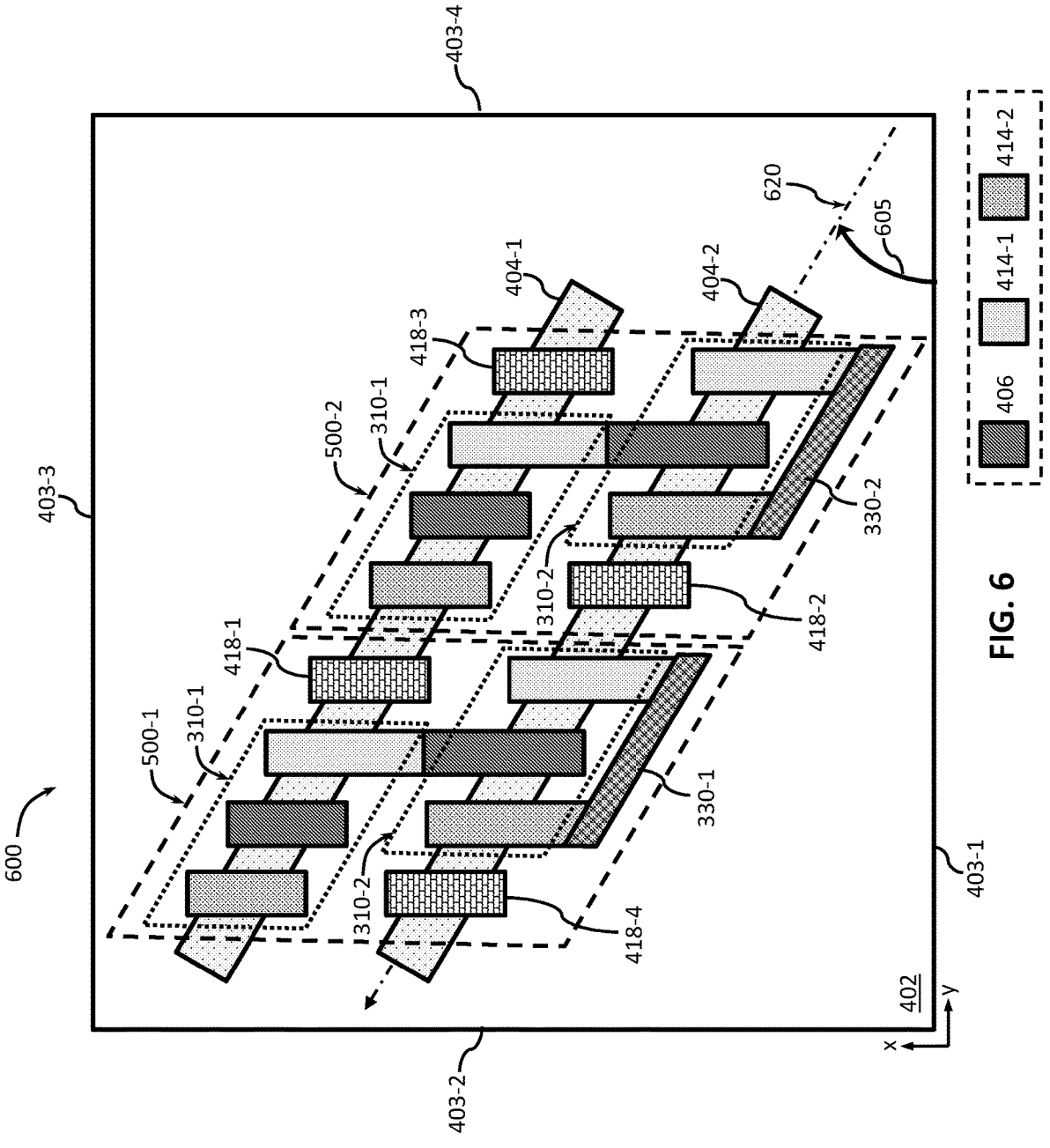
FIG. 6 provides a top-down view of an example IC device implementing 2T memory cells of FIG. 5, in accordance with some embodiments.

FIG. 1 provides a perspective view of an example IC device 100 implementing a nanoribbon transistor 110, in accordance with some embodiments. The nanoribbon transistor 110 is one example of a transistor that may be used either as an access transistor or a storage transistor of a 2T memory cell with source-drain coupling in one transistor and that may be included in various IC devices and assemblies described herein. Because FIG. 1 is provided to assist explanations of what, in general, a nanoribbon transistor is, it does not illustrate the nanoribbon of the nanoribbon transistor 110 being angled with respect to the edges of a support structure or with respect to its gate. Instead, FIG. 6 provides an example illustration of angled transistors.

Turning to the details of FIG. 1, the IC device 100 may include a semiconductor material, which may include one or more semiconductor materials, formed as a nanoribbon 104 (e.g., an elongated structure) extending substantially parallel to a support structure 102. The transistor 110 may be formed on the basis of the nanoribbon 104 by having a gate stack 106 at least partially wrap around a portion of the nanoribbon referred to as a "channel region" and by having source and drain regions, shown in FIG. 1 as a first S/D region 114-1 and a second S/D region 114-2, on either side of the gate stack 106. In some embodiments, a layer of oxide material (not specifically shown in FIG. 1) may be provided between the support structure 102 and the gate stack 106.

The IC device 100 shown in FIG. 1, as well as IC devices shown in other drawings of the present disclosure, are intended to show relative arrangements of some of the components therein, and these IC devices, or portions thereof, may include other components that are not illustrated. For example, although not specifically illustrated in FIG. 1, a dielectric spacer may be provided between a first S/D contact (not shown in FIG. 1) that may be coupled to a first S/D region 114-1 of the transistor 110 and the gate stack 106 as well as between a second S/D contact (also not shown in FIG. 1) that may be coupled to a second S/D region 114-2 of the transistor 110 and the gate stack 106 in order to provide electrical isolation between the source, gate, and drain contacts (in general, such contacts may also be referred to as "electrodes"). In another example, although not specifically illustrated in FIG. 1, at least portions of the transistor 110 may be surrounded in an insulator material, such as any suitable interlayer dielectric (ILD) material. In some embodiments, such an insulator material may be a high-k dielectric including elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In other embodiments, the insulator material surrounding portions of the transistor 110 may be a low-k dielectric material. Some examples of low-k dielectric materials include, but are not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass. Similar considerations are applicable to other IC devices shown in the present drawings, e.g., those shown in FIG. 2, FIG. 4, and FIG. 6.

Implementations of the present disclosure may be formed or carried out on any suitable support structure 102, such as a substrate, a die, a wafer, or a chip. The support structure 102 may, e.g., be the wafer 2000 of FIG. 7, discussed below, and may be, or be included in, a die, e.g., the singulated die 2002 of FIG. 7, discussed below. The support structure 102 may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (e.g., materials from groups III and V of the periodic system of elements), group II-VI (e.g., materials from groups II and IV of the periodic system of elements), or group IV materials (e.g., materials from group IV of the periodic system of elements). In some embodiments, the substrate may be non-crystalline. In some embodiments, the support structure 102 may be a printed circuit board (PCB) substrate. Although a few examples of materials from which the support structure 102 may be formed are described here, any material that may serve as a foundation upon which an IC device with one or more 2T memory cells with source-drain coupling in one transistor as described herein may be built falls within the spirit and scope of the present disclosure. As used herein, the term "support structure" does not necessarily mean that it provides mechanical support for the IC devices/structures (e.g., transistors, capacitors, interconnects, and so on) built thereon. For example, some other structure may provide such mechanical support and the support structure 102 may provide material "support" in that, e.g., the IC devices/structures are build based on the semiconductor materials of the support structure 102. However, in some embodiments, the support structure 102 may provide mechanical support.

The nanoribbon 104 may take the form of a nanowire or nanoribbon, for example. In some embodiments, an area of a transverse cross-section of the nanoribbon 104 (e.g., an area in the x-z plane of the example coordinate system x-y-z shown in FIG. 1) may be between about 25 and 10000 square nanometers, including all values and ranges therein (e.g., between about 25 and 1000 square nanometers, or between about 25 and 500 square nanometers). The transverse cross-section of the nanoribbon 104 is cross-section along a plane perpendicular to a longitudinal axis 120 of the nanoribbon 104, where the longitudinal axis 120 may, e.g., be along the y-axis of the example coordinate system shown in FIG. 1. In some embodiments, a width of the nanoribbon 104 (e.g., a dimension measured in a plane parallel to the support structure 102 and in a direction perpendicular to the longitudinal axis 120, e.g., along the x-axis of the example coordinate system shown FIG. 1) may be at least about 3 times larger than a thickness (or a "height") of the nanoribbon 104 (e.g., a dimension measured in a plane perpendicular to the support structure 102, e.g., along the z-axis of the example coordinate system shown in FIG. 1), including all values and ranges therein, e.g., at least about 4 times larger, or at least about 5 times larger.

It should be noted that FIG. 1 illustrates the x-y-z coordinate system being aligned so that the longitudinal axis 120 is along the y-axis and the gate being aligned along the x-axis only for the ease of explanations of this particular drawing. However, for nanoribbon transistors that are implemented as angled transistors as described herein, the longitudinal axis 120 would be in the x-y plane but angled (e.g., at an angle between about 10 and 80 degrees) with respect to the y-axis.

Although the nanoribbon 104 illustrated in FIG. 1 is shown as having a rectangular cross-section, the nanoribbon 104 may instead have a cross-section that is rounded at corners or otherwise irregularly shaped, and the gate stack 106 may conform to the shape of the nanoribbon 104. The terms "front side" and "back side" of a nanoribbon may refer to the faces of the nanoribbon 104 that are substantially parallel to the support structure 102, the term "sidewall" (or "side face") of a nanoribbon may refer to the opposing faces of the nanoribbon 104 that are substantially perpendicular to the support structure 102 and extend in a direction of the longitudinal axis 120 of the nanoribbon 104, while the term "end" of a nanoribbon may refer to the opposing faces of the nanoribbon 104 that are substantially perpendicular to the longitudinal axis 120 of the nanoribbon 104.

The nanoribbon 104 may be formed of one or more semiconductor materials, together referred to as a "channel material." In general, channel materials of any of the transistors described herein, e.g., the channel material of the transistor 110, may be composed of semiconductor material systems including, for example, N-type or P-type materials systems. In some embodiments, the channel material may include a substantially monocrystalline semiconductor, such as silicon (Si) or germanium (Ge). In some embodiments, the channel material may include a compound semiconductor with a first sub-lattice of at least one element from group III of the periodic table (e.g., Al, Ga, In), and a second sub-lattice of at least one element of group V of the periodic table (e.g., P, As, Sb). In some embodiments, the channel material may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material may include a combination of semiconductor materials.

For some example N-type transistor embodiments (e.g., for the embodiments where the transistor in which channel material is included is an N-type metal-oxide-semiconductor (NMOS) transistor), the channel material may include a III-V material having a relatively high electron mobility, such as, but not limited to InGaAs, InP, InSb, and InAs. For some such embodiments, the channel material may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). For some example P-type transistor embodiments (e.g., for the embodiments where the transistor in which the channel material is included is a P-type metal-oxide-semiconductor (PMOS) transistor), the channel material may advantageously be a group IV material having a high hole mobility, such as, but not limited to Ge or a Ge-rich SiGe alloy. For some example embodiments, the channel material may have a Ge content between 0.6 and 0.9, and advantageously may be at least 0.7.

In some embodiments, the channel material may be a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the channel material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc.

As noted above, the channel material may include IGZO. IGZO-based devices have several desirable electrical and manufacturing properties. IGZO has high electron mobility compared to other semiconductors, e.g., in the range of 20-50 times than amorphous silicon. Furthermore, amorphous IGZO (a-IGZO) transistors are typically characterized by high band gaps, low-temperature process compatibility, and low fabrication cost relative to other semiconductors.

IGZO can be deposited as a uniform amorphous phase while retaining higher carrier mobility than oxide semiconductors such as zinc oxide. Different formulations of IGZO include different ratios of indium oxide, gallium oxide, and zinc oxide. One particular form of IGZO has the chemical formula $InGaO_3(ZnO)_5$. Another example form of IGZO has an indium:gallium:zinc ratio of 1:2:1. In various other examples, IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10). IGZO can also contain tertiary dopants such as aluminum or nitrogen.

In some embodiments, any of the transistors that may be part of 2T memory cells with source-drain coupling in one transistor as described herein, e.g., the transistor 110, may be a thin-film transistor (TFT). A TFT is a special kind of a FET made by depositing active semiconductor material over a support (e.g., a support structure as described above) that may be a non-conducting support. Some such materials may be deposited at relatively low temperatures, which allows depositing them within the thermal budgets imposed on back-end fabrication to avoid damaging the front-end components such as the logic devices of an IC device in which the transistor may be included. Thus, in some embodiments, the channel material of any of the transistors that may be implemented to have angled gates described herein, e.g., the transistor 110, may be a semiconductor material deposited at relatively low temperatures, and may include any of the oxide semiconductor materials described above.

In other embodiments, instead of being deposited at relatively low temperatures as described above with reference to the TFTs, the channel material of any of the transistors that may be part of 2T memory cells with source-drain coupling in one transistor as described herein, e.g., the transistor 110, may be epitaxially grown in what typically involves relatively high-temperature processing. In such embodiments, the channel material may include any of the semiconductor materials described above, including oxide semiconductor materials. In some such embodiments, the channel material may be epitaxially grown directly on a semiconductor layer of a support structure over which the transistor will be fabricated, in a process known as "monolithic integration." In other such embodiments, the channel material of any of the transistors that may be part of 2T memory cells with source-drain coupling in one transistor as described herein, e.g., the transistor 110, may be epitaxially grown on a semiconductor layer of another support structure and then the epitaxially grown layer of the channel material may be transferred, in a process known as a "layer transfer," to a support structure over which the transistor will reside, in which case the latter support structure may but does not have to include a semiconductor layer prior to the layer transfer. Layer transfer advantageously allows forming transistors, such as FinFETs or nanoribbon transistors, over support structures or in layers that do not include semiconductor materials (e.g., in the back end of an IC device). Layer transfer also advantageously allows forming transistors of any architecture (e.g., non-planar or planar transistors) without imposing the negative effects of the relatively high-temperature epitaxial growth process on devices that may already be present over a support structure.

A channel material that is deposited at relatively low temperatures is typically a polycrystalline, polymorphous, or amorphous semiconductor, or any combination thereof. A channel material that is epitaxially grown is typically a highly crystalline (e.g., monocrystalline or single-crystalline) material. Therefore, whether the channel material of any of the transistors described herein, is deposited at relatively low temperatures or epitaxially grown can be identified by inspecting grain size of the active portions of the channel material (e.g., of the portions of the channel material that form channels of transistors). An average grain size of a channel material of a transistor being between about 0.5 and 1 millimeters (in which case the material may be polycrystalline) or smaller than about 0.5 millimeter (in which case the material may be polymorphous or amorphous) may be indicative of the channel material having been deposited (e.g., if the transistor in which such a channel material is included is a TFT). On the other hand, an average grain size of a channel material of a transistor being equal to or greater than about 1 millimeter (in which case the material may be a single-crystal material) may be indicative of the channel material having been epitaxially grown and included in the final device either by monolithic integration or by layer transfer.

In some embodiments, the channel material of any of the transistors that may be part of 2T memory cells with source-drain coupling in one transistor as described herein, e.g., the transistor 110, may include a two-dimensional (2D) semiconductor material, e.g., a semiconductor material with a thickness of a few nanometers or less, where electrons in the material are free to move in the 2D plane but their restricted motion in the third direction is governed by quantum mechanics. In some such embodiments, such a channel material may include a single atomic monolayer of a 2D semiconductor material, while, in other such embodiments, such a channel material may include five or more atomic monolayers of a 2D semiconductor material. Examples of 2D materials that may be used as the channel material include, but are not limited to, graphene, hexagonal boron nitride, or transition-metal chalcogenides.

A gate stack 106 including a gate electrode material 108 and, optionally, a gate insulator 112, may wrap entirely or almost entirely around a portion of the nanoribbon 104 as shown in FIG. 1, with the channel region of the transistor 110 being the active region (channel region) of the channel material in the portion of the nanoribbon 104 wrapped by the gate stack 106. The gate insulator 112 is not shown in the perspective drawing of the IC device 100 shown in FIG. 1 but is shown in an inset 130 of FIG. 1, providing a cross-sectional side view of a portion of the nanoribbon 104 with a gate stack 106 wrapping around it. As shown in FIG. 1, the gate insulator 112 may wrap around a transversal portion/cross-section of the nanoribbon 104, and the gate electrode material 108 may wrap around the gate insulator 112.

The gate electrode material 108 may include at least one P-type work function metal or N-type work function metal, depending on whether the transistor 110 is a PMOS transistor or an NMOS transistor. P-type work function metal may be used as the gate electrode material 108 when the transistor 110 is a PMOS transistor and N-type work function metal may be used as the gate electrode material 108 when the transistor 110 is an NMOS transistor. For a PMOS transistor, metals that may be used for the gate electrode material 108 may include, but are not limited to, ruthenium, palladium, platinum, cobalt, nickel, and conductive metal oxides (e.g., ruthenium oxide). For an NMOS transistor, metals that may be used for the gate electrode material 108 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

In some embodiments, the gate electrode material 108 may include a stack of two or more metal layers, where one or more metal layers are work function metal layers and at least one metal layer is a fill metal layer. Further layers may be included next to the gate electrode material 108 for other purposes, such as to act as a diffusion barrier layer or/and an adhesion layer.

In some embodiments, the gate insulator 112 may include one or more high-k dielectrics including any of the materials discussed herein with reference to the insulator material that may surround portions of the transistor 110. In some embodiments, an annealing process may be carried out on the gate insulator 112 during manufacture of the transistor 110 to improve the quality of the gate insulator 112. The gate insulator 112 may have a thickness that may, in some embodiments, be between about 0.5 nanometers and 3 nanometers, including all values and ranges therein (e.g., between about 1 and 3 nanometers, or between about 1 and 2 nanometers), although, in other embodiments, the thickness of the gate insulator 112 may be greater than 3 nanometers. In some embodiments, the gate stack 106 may be surrounded by a gate spacer, not shown in FIG. 1. Such a gate spacer would be configured to provide separation between the gate stack 106 and source/drain contacts of the transistor 110 and could be made of a low-k dielectric material, some examples of which have been provided above. A gate spacer may include pores or air gaps to further reduce its dielectric constant.

In some embodiments, the gate insulator 112 may include a hysteretic material or a hysteretic arrangement, which, together, may be referred to as a "hysteretic element." Transistors 110 in which the gate insulator 124 includes a hysteretic element may be described as "hysteretic transistors" and may be used to implement hysteretic memory. Hysteretic memory refers to a memory technology employing hysteretic materials or arrangements, where a material or an arrangement may be described as hysteretic if it exhibits the dependence of its state on the history of the material (e.g., on a previous state of the material). Ferroelectric (FE) and antiferroelectric (AFE) materials are examples of hysteretic materials. Layers of different materials arranged in a stack to exhibit charge-trapping phenomena is an example of a hysteretic arrangement.

A FE or an AFE material is a material that exhibits, over some range of temperatures, spontaneous electric polarization, e.g., displacement of positive and negative charges from their original position, where the polarization can be reversed or reoriented by application of an electric field. In particular, an AFE material is a material that can assume a state in which electric dipoles from the ions and electrons in the material may form a substantially ordered (e.g., substantially crystalline) array, with adjacent dipoles being oriented in opposite (antiparallel) directions (e.g., the dipoles of each orientation may form interpenetrating sub-lattices, loosely analogous to a checkerboard pattern), while a FE material is a material that can assume a state in which all of the dipoles point in the same direction. Because the displacement of the charges in FE and AFE materials can be maintained for some time even in the absence of an electric field, such materials may be used to implement memory cells. Because the current state of the electric dipoles in FE and AFE materials depends on the previous state, such materials are hysteretic materials. Memory technology where logic states are stored in terms of the orientation of electric dipoles in (e.g., in terms of polarization of) FE or AFE materials is referred to as "FE memory," where the term "ferroelectric" is said to be adopted to convey the similarity of FE memories to ferromagnetic memories, even though there is typically no iron (Fe) present in FE or AFE materials.

A stack of alternating layers of materials that is configured to exhibit charge-trapping is an example of a hysteretic arrangement. Such a stack may include as little as two layers of materials, one of which is a charge-trapping layer (e.g., a layer of a material configured to trap charges when a voltage is applied across the material) and the other one of which is a tunneling layer (e.g., a layer of a material through which the charge is to be tunneled to the charge-trapping layer). The tunneling layer may include an insulator material such as a material that includes silicon and oxygen (e.g., silicon oxide), or any other suitable insulator. The charge-trapping layer may include a metal or a semiconductor material that is configured to trap charges. Because the trapped charges may be kept in a charge-trapping arrangement for some time even in the absence of an electric field, such arrangements may be used to implement memory cells. Because the presence and/or the number of trapped charges in a charge-trapping arrangement depends on the previous state, such arrangements are hysteretic arrangements. Memory technology where logic states are stored in terms of the amount of charge trapped in a hysteretic arrangement may be referred to as "charge-trapping memory."

Hysteretic memories have the potential for adequate non-volatility, short programming time, low power consumption, high endurance, and high-speed writing. In addition, hysteretic memories may be manufactured using processes compatible with the standard complementary metal-oxide-semiconductor (CMOS) technology. Therefore, over the last few years, these types of memories have emerged as promising candidates for many growing applications.

In some embodiments, the hysteretic element of the gate insulator 112 may be provided as a layer of a FE or an AFE material. Such an FE/AFE material may include one or more materials that can exhibit sufficient FE/AFE behavior even at thin dimensions, e.g., such as an insulator material at least about 5%, e.g., at least about 7% or at least about 10%, of which is in an orthorhombic phase and/or a tetragonal phase (e.g., as a material in which at most about 95-90% of the material may be amorphous or in a monoclinic phase). For example, such materials may be based on hafnium and oxygen (e.g., hafnium oxides), with various dopants added to ensure sufficient amount of an orthorhombic phase or a tetragonal phase. Some examples of such materials include materials that include hafnium, oxygen, and zirconium (e.g., hafnium zirconium oxide (HfZrO, also referred to as HZO)), materials that include hafnium, oxygen, and silicon (e.g., silicon-doped (Si-doped) hafnium oxide), materials that include hafnium, oxygen, and germanium (e.g., germanium-doped (Ge-doped) hafnium oxide), materials that include hafnium, oxygen, and aluminum (e.g., aluminum-doped (Al-doped) hafnium oxide), and materials that include hafnium, oxygen, and yttrium (e.g., yttrium-doped (Y-doped) hafnium oxide). However, in other embodiments, any other materials which exhibit FE/AFE behavior at thin dimensions may be used as the hysteretic element and are within the scope of the present disclosure.

In other embodiments, the hysteretic element of the gate insulator 112 may be provided as a stack of alternating layers of materials that can trap charges. In some such embodiments, the stack may be a two-layer stack, where one layer is a charge-trapping layer, and the other layer is a tunneling layer. The tunneling layer may include an insulator material such as a material that includes silicon and oxygen (e.g., silicon oxide), or any other suitable insulator. The charge-trapping layer may include an electrically conductive material such as a metal, or a semiconductor material. In some embodiments, the charge-trapping layer may include a sub-stoichiometric material (e.g., a material that includes less than a stochiometric amount of a reagent). The sub-stoichiometric material may include vacancies in concentration of at least about $10^{18}$ vacancies per cubic centimeter, e.g., in concentration between about $10^{18}$ vacancies per cubic centimeter and about $10^{22}$-$10^{23}$ vacancies per cubic centimeter. As known in the art, vacancies refer to cites where atoms (e.g., oxygen or nitrogen) that should be present are missing, thus providing a defect in a material. For example, the sub-stoichiometric material of any of the hysteretic elements described herein may include oxygen and the vacancies may be oxygen vacancies, or the sub-stoichiometric material may include nitrogen and the vacancies may be nitrogen vacancies. During operation, charges may be trapped in the vacancies of the sub-stoichiometric material. Thus, implementing a sub-stoichiometric material with vacancies is one way to provide a charge-trapping layer of a hysteretic arrangement. In general, any material that has defects that can trap charge may be used in/as a charge-trapping layer. Such defects are very detrimental to operation of logic devices and, therefore, typically, deliberate steps need to be taken to avoid presence of the defects. However, for memory devices, such defects may be desirable because charge-trapping may be used to represent different memory states of a memory cell.

In some embodiments of the hysteretic element being provided as a stack of alternating layers of materials that can trap charges, the stack may be a three-layer stack where an insulator material is provided on both sides of a charge-trapping layer. In such embodiments, a layer of an insulator material on one side of the charge-trapping layer may be referred to as a "tunneling layer" while a layer of an insulator material on the other side of the charge-trapping layer may be referred to as a "field layer."

In various embodiments of the hysteretic element being provided as a stack of alternating layers of materials that can trap charges, a thickness of each layer the stack may be between about and 10 nanometers, including all values and ranges therein, e.g., between about 0.5 and 5 nanometers. In some embodiment of a three-layer stack, a thickness of each layer of the insulator material may be about 0.5 nanometers, while a thickness of the charge-trapping layer may be between about 1 and 8 nanometers, e.g., between about 2.5 and 7.5 nanometers, e.g., about 5 nanometers. In some embodiments, a total thickness of the hysteretic element provided as a stack of alternating layers of materials that can trap charges (e.g., a hysteretic arrangement) may be between about 1 and 10 nanometers, e.g., between about 2 and 8 nanometers, e.g., about 6 nanometers.

Turning to the S/D regions 114 of the transistor 110, in some embodiments, the S/D regions may be highly doped, e.g., with dopant concentrations of about $10^{21}$ dopants per cubic centimeter, in order to advantageously form Ohmic contacts with the respective S/D electrodes, although these regions may also have lower dopant concentrations and may form Schottky contacts in some implementations. Irrespective of the exact doping levels, the S/D regions of a transistor may be the regions having dopant concentration higher than in other regions, e.g., higher than a dopant concentration in the channel region (e.g., in a channel material extending between the first S/D region 114-1 and the second S/D region 114-2), and, therefore, may be referred to as "highly doped" (HD) regions. The channel region of the transistor 110 may include semiconductor materials with doping concentrations significantly smaller than those of the S/D regions 114.

The S/D regions 114 of the transistor 110 may generally be formed using either an implantation/diffusion process or an etching/deposition process. In the former process, dopants such as boron, aluminum, antimony, phosphorous, or arsenic may be ion-implanted into the nanoribbon 104 to form the source and drain regions. An annealing process that activates the dopants and causes them to diffuse further into the nanoribbon 104 may follow the ion implantation process. In the latter process, portions of the nanoribbon 104 may first be etched to form recesses at the locations of the future S/D regions 114. An epitaxial deposition process may then be carried out to fill the recesses with material that is used to fabricate the S/D regions 114. In some implementations, the S/D regions 114 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 114 may be formed using one or more alternate semiconductor materials such as germanium or a group III-V material or alloy. And in further embodiments, one or more layers of metal and/or metal alloys may be used to form the S/D regions 114. In some embodiments, a distance between the first and second S/D regions 114 (e.g., a dimension measured along the longitudinal axis 120 of the nanoribbon 104) may be between about 5 and 40 nanometers, including all values and ranges therein (e.g., between about 22 and 35 nanometers, or between about 20 and nanometers).

Figure 2:
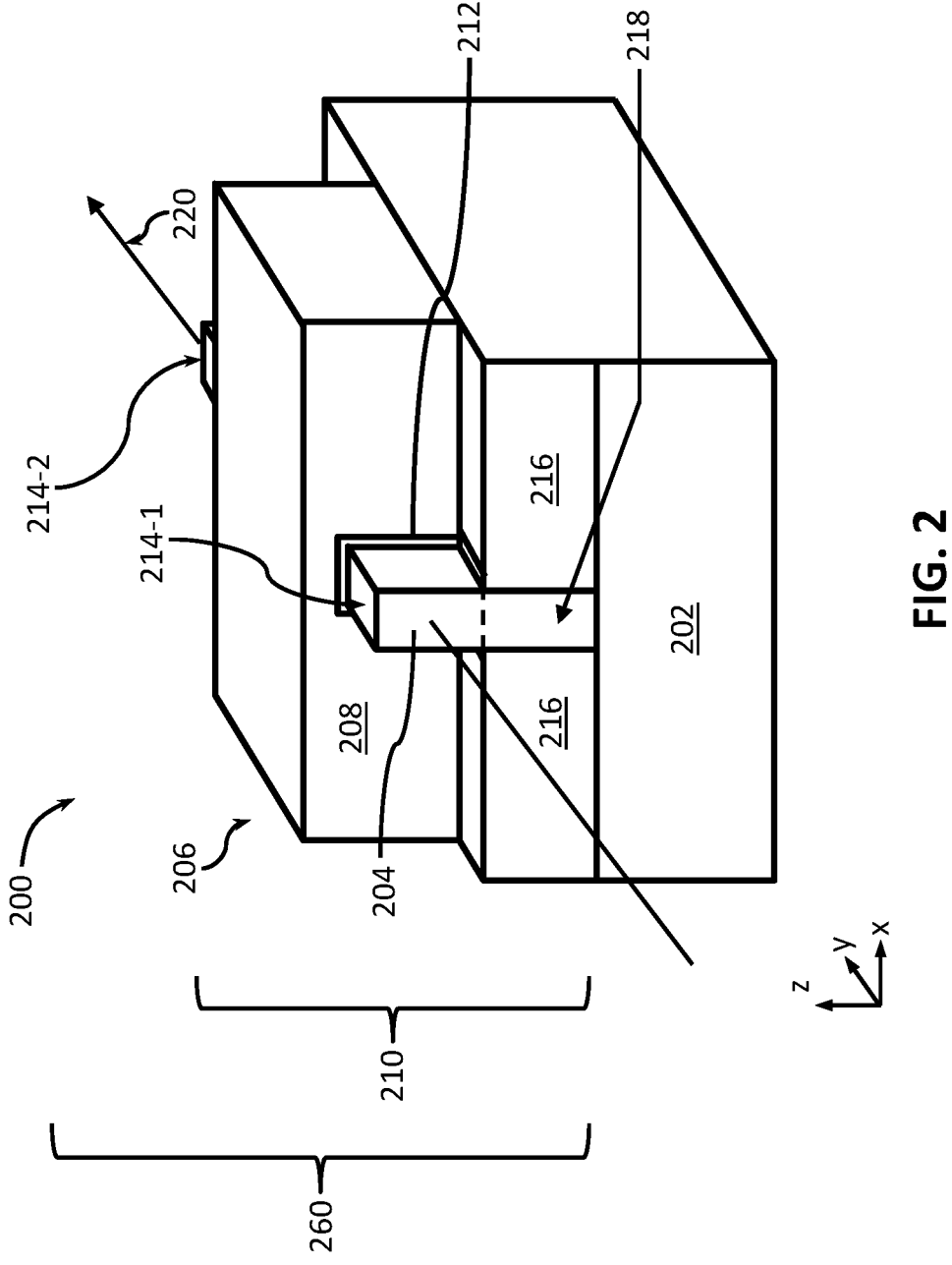
FIG. 2 provides a perspective view of an example IC device implementing a fin-based field-effect transistor (FinFET), in accordance with some embodiments.

FIG. 2 provides a perspective view of an example IC device 200 implementing a FinFET 210, in accordance with some embodiments. The FinFET 210 is another example of a transistor that may be used either as an access transistor or a storage transistor of a 2T memory cell with source-drain coupling in one transistor and that may be included in various IC devices and assemblies described herein.

Turning to the details of FIG. 2, the IC device 200 may include a semiconductor material, which may include one or more semiconductor materials, formed as a fin 204 extending away from a support structure 202. A FinFET 210 may be formed on the basis of the fin 204 by having a gate stack 206 at least partially wrap around a channel region of the fin 204 and by having source and drain regions, shown in FIG. 2 as a first S/D region 214-1 and a second S/D region 214-2, on either side of the gate stack 206. As shown in FIG. 2, the gate stack 206 includes a gate electrode material 208 and a gate insulator 212, each of which wraps entirely or almost entirely around the channel region of the fin 204, although in other embodiments of the IC device 200 the gate insulator 212 may be absent. Descriptions provided above with reference to the support structure 102, the gate stack 106, the gate electrode material 108, the gate insulator 112, and the S/D regions 114 are applicable to, respectively, the support structure 202, the gate stack 206, the gate electrode material 208, the gate insulator 212, and the S/D regions 214, and, therefore, in the interests of brevity, are not repeated. FIG. 2 further illustrates an STI 216, enclosing sidewalls of a subfin portion 218 of the fin 204. The STI 216 may include any of the insulator materials described above, e.g., any suitable ILD materials. Descriptions provided above with reference to the channel material of the transistor 110 are applicable to the semiconductor material of at least a channel region of the fin 204 (e.g., of at least a portion of the fin 204 wrapped by the gate stack 206) and, therefore, in the interests of brevity, are not repeated.

A longitudinal axis 220 of the fin 204 may be along the y-axis of the example coordinate system shown in the present drawings. The FinFET 210 may have a gate length (e.g., a distance between the first and second S/D regions 214-1, 214-2), a dimension measured along the longitudinal axis 220, which may, in some embodiments, be between 2 and 60 nanometers, including all values and ranges therein (e.g., between 5 and 20 nanometers, or between 5 and 30 nanometers). Although the fin 204 is illustrated in FIG. 2 as having a rectangular cross-section in an x-z plane, the fin 204 may instead have a cross-section that is rounded or sloped at the "top" of the fin 204, and the gate stack 206 may conform to this rounded or sloped fin 204. In use, the FinFET 210 may form conducting channels on three "sides" of the fin 204, potentially improving performance relative to single-gate transistors (which may form conducting channels on one "side" of a channel material or substrate) and double-gate transistors (which may form conducting channels on two "sides" of a channel material or substrate). It should be noted that, similar to FIG. 1, FIG. 2 illustrates the x-y-z coordinate system being aligned so that the longitudinal axis 220 is along the y-axis and the gate being aligned along the x-axis only for the ease of explanations of this particular drawing. However, for FinFETs that are implemented as angled transistors as described herein, the longitudinal axis 220 would be in the x-y plane but angled (e.g., at an angle between about 10 and 80 degrees) with respect to the y-axis.

Either the nanoribbon 104 or the fin 204 may be an elongated structure based on which any of the transistors of the 2T memory cells with source-drain coupling in one transistor may be built. In other words, any of the transistors within 2T memory cells with source-drain coupling in one transistor as described herein may be implemented as, e.g., the transistor 110 or the FinFET 210. However, in other embodiments, 2T memory cells with source-drain coupling in one transistor as described herein may be implemented using transistors of other architectures, e.g., planar transistors.

Figure 3:
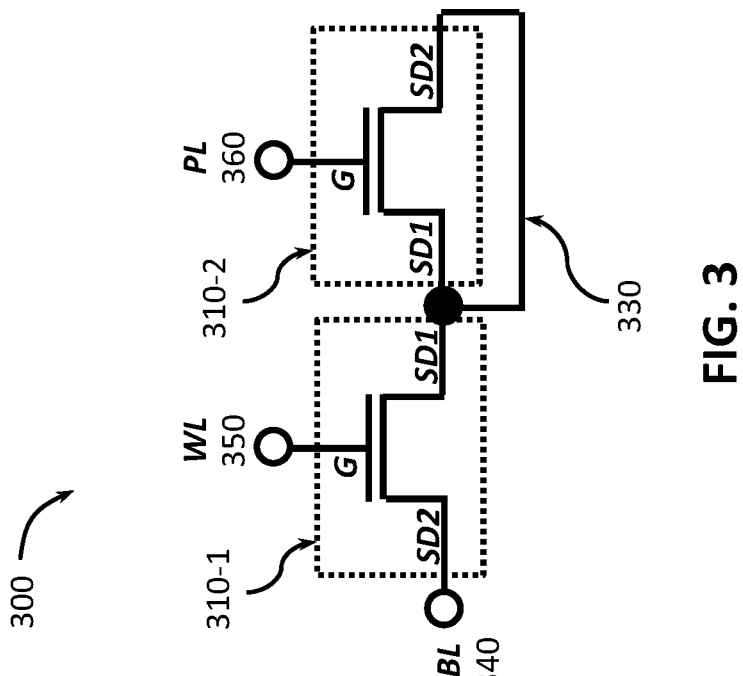
FIG. 3 provides an electric circuit diagram of a two transistor (2T) memory cell with source-drain coupling in one transistor, in accordance with some embodiments.
Figure 4A:
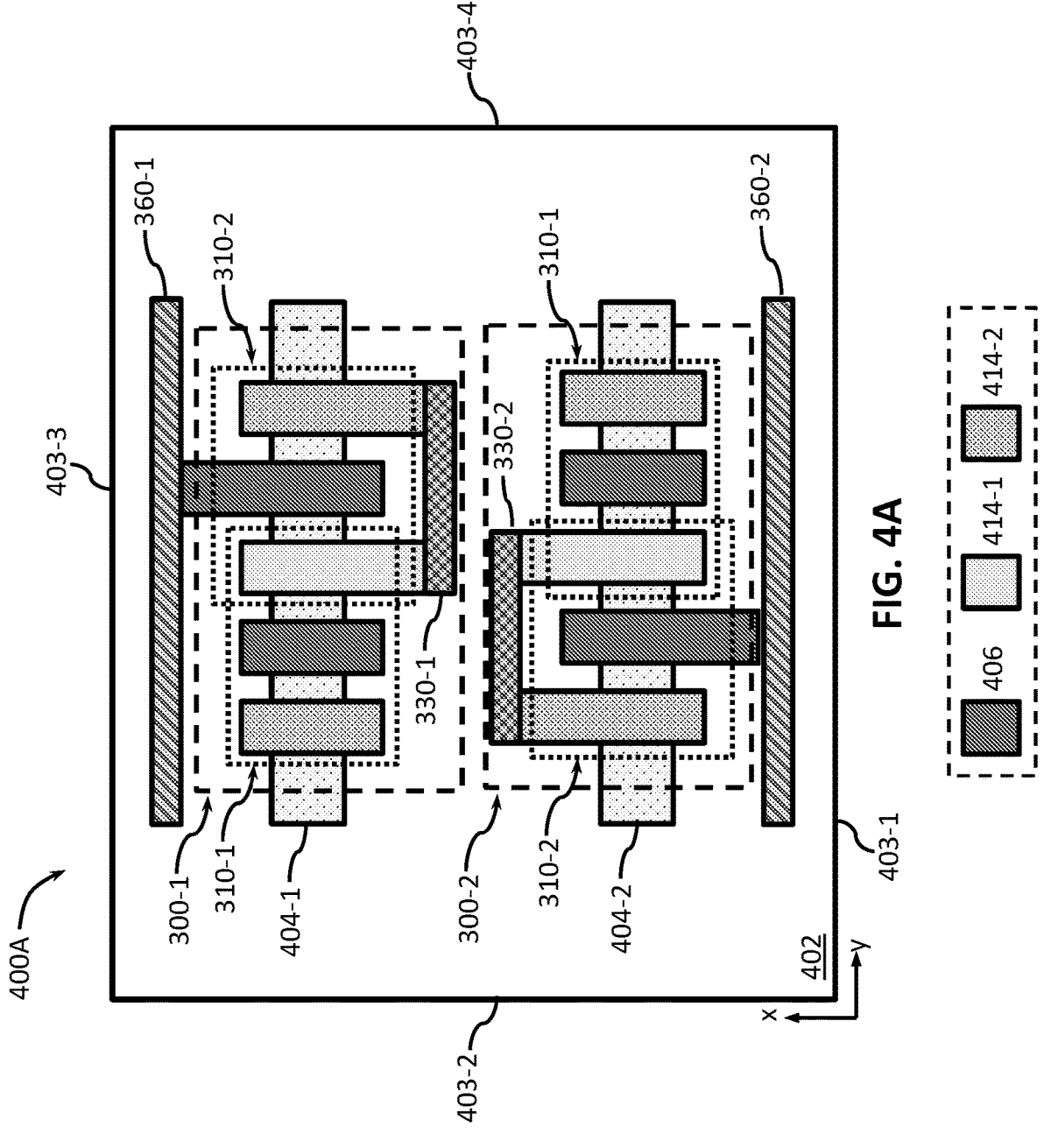
FIGS. 4A-4B provide top-down views of alternative example IC devices implementing 2T memory cells of FIG. 3, in accordance with some embodiments.
Figure 4B:
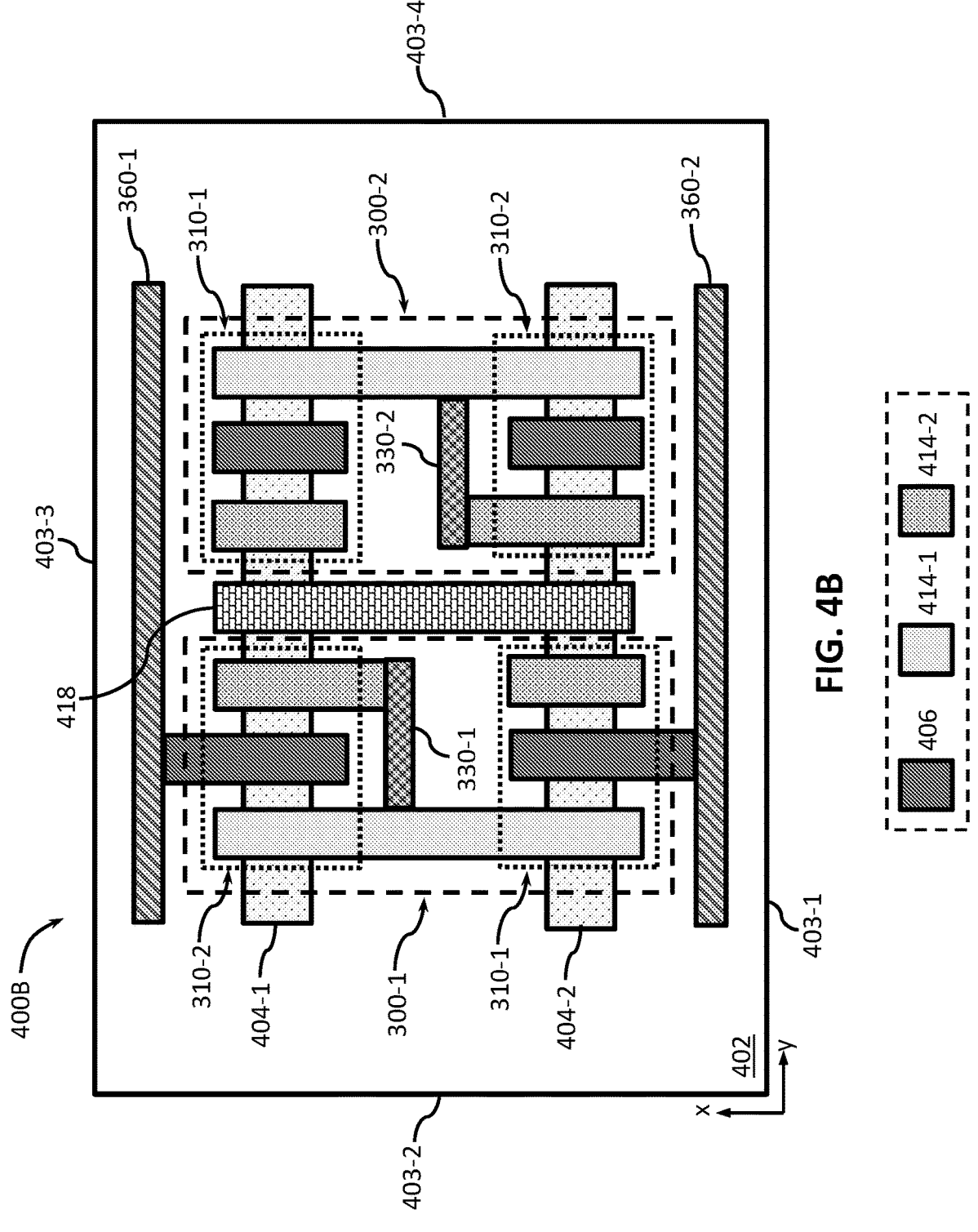
Figure 5:
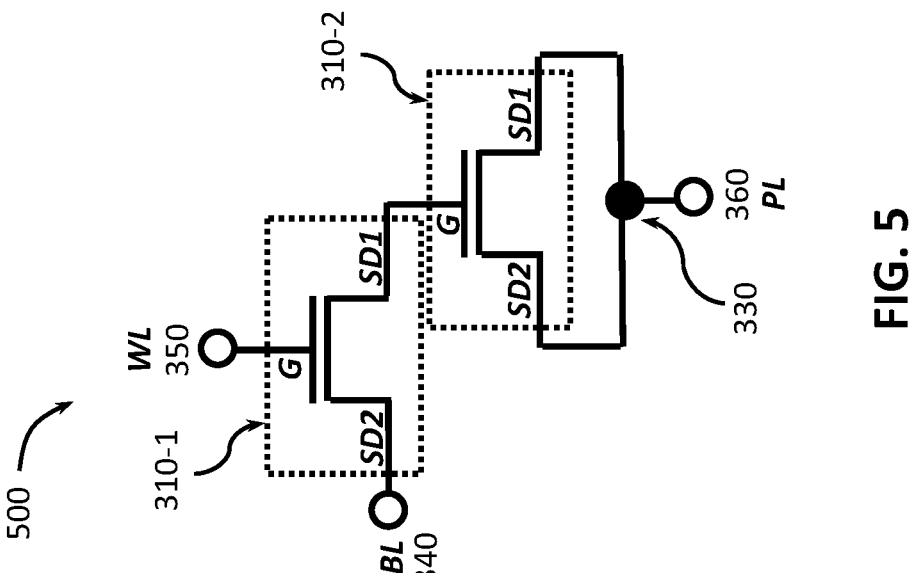
FIG. 5 provides an electric circuit diagram of a 2T memory cell with source-drain coupling in one transistor, in accordance with other embodiments.

FIG. 3 provides an electric circuit diagram of a 2T memory cell 300 with source-drain coupling in one transistor, in accordance with some embodiments, while FIG. 5 provides an electric circuit diagram of a 2T memory cell 500 with source-drain coupling in one transistor, in accordance with other embodiments. In FIGS. 3 and 5, each of the transistors is illustrated using a conventional electric circuit diagram representation with gate, first S/D, and second S/D terminals being labeled as, respectively, G, SD1, and SD2, with individual transistors enclosed within respective dotted contours. FIGS. 4 and 6 show top-down views of alternative example IC devices implementing 2T memory cells of FIGS. 3 and 5, respectively, in accordance with some embodiments.

Turning to the details of FIG. 3, as shown, the 2T memory cell 300 includes two transistors 310, one of which is an access transistor 310-1 and another one is a storage transistor 310-2. FIG. 3 illustrates that the first S/D terminal of the access transistor 310-1 is coupled to the first S/D terminal of the storage transistor 310-2, the second S/D terminal of the access transistor 310-1 is coupled to the BL 340, and the gate terminal of the access transistor 310-1 is coupled to the WL 350. The second S/D terminal of the storage transistor 310-2 is coupled to the first S/D terminal of the storage transistor 310-2, e.g., by means of an interconnect 330, and, therefore, is also coupled to the first S/D terminal of the access transistor 310-1 (by virtue of the first S/D terminal of the storage transistor 310-2 being coupled to the first S/D terminal of the access transistor 310-1). FIG. 3 further illustrates that the gate terminal of the storage transistor 310-2 is coupled (e.g., directly connected) to the PL 360.

In general, READ and WRITE access to the 2T memory cell 300 (i.e., performance of READ and WRITE operations) is realized using a combination of the BL 340, the WL 350, and the PL 360, each of which is an interconnect (e.g., an electrically conductive line) to which a certain voltage is applied to sense (i.e., READ) or program (i.e., WRITE) a memory state of the 2T memory cell 300. Together, the BL 340, the WL 350, and the PL 360 are referred to herein as "memory control lines" (or, simply, "control lines") because they are used to control a memory state of the 2T memory cell 300.

Because the first S/D terminals of the transistors 310, as well as the second S/D terminal of the storage transistor 310-2, are all coupled together, they will have the same potential during operation of the 2T memory cell 300. The 2T memory cell 300 may then be operated by applying appropriate signals to the BL 340, the WL 350, and the PL 360 to store charge in the storage transistor 310-2 (i.e., to perform a write operation) or to sense the charge stored in the storage transistor 310-2 (i.e., to perform a read operation). For example, by applying a voltage equal to or greater than the threshold voltage to the gate terminal of the access transistor 310-1, current flow between the first and second S/D terminals of the access transistor 310-1 is enabled (i.e., the access transistor 310-1 may be turned on). Consequently, a charge may be stored in the storage transistor 310-2 based on voltages applied to the BL 340 and the PL 360, or a charge that was already stored in the storage transistor 310-2 may be read by sending the voltage on the BL 340 when a suitable voltage is applied to the PL 360.

FIGS. 4A-4B provide top-down views of alternative example IC devices 400A-400B implementing 2T memory cells 300 of FIG. 3, in accordance with some embodiments. Similar to FIG. 3, FIGS. 4A-4B also illustrate dotted contours to show approximate outlines of different transistors. Furthermore, FIGS. 4A-4B illustrate dashed contours to show approximate outlines of different ones of the two 2T memory cells 300, labeled as cells 300-1 and 300-2. The same applies to FIG. 6.

As shown in FIGS. 4A-4B, the IC device 400 may include two elongated structures 404, labeled as elongated structures 404-1 and 404-2, provided over a support structure 402. The elongated structures 404 may, e.g., be either the nanoribbon 104 or the fin 204, as described above, or may be planar structures of any of the channel materials described above. The support structure 402 may be the support structure 102 or 204, or any other suitable support structure for housing the IC devices with 2T memory cells as described herein. As shown in FIGS. 4A-4B, the support structure 402 may include four edges 403, individually shown as an edge 403-1, 403-2, 403-3, and 403-4. The edges 403 may be edges of either the front side of the support structure 402 or the back side of the support structure 402, depending on whether the elongated structures 404 are provided on the front side or the back side of the support structure 402. The support structure 402 is, typically, rectangular and, therefore, adjacent ones of the edges 403 are at 90 degrees with respect to one another (e.g., the edges 403-1 and 403-2 are adjacent and at 90 degrees with respect to one another, the edges 403-2 and 403-3 are adjacent and at 90 degrees with respect to one another, and so on). Each of FIGS. 4A-4B illustrates two transistors 310 provided along each of the elongated structures 404-1 and 404-2, thus showing a total of four transistors 310. Each of FIGS. 4A-4B further illustrates first S/D contacts 414-1, second S/D contacts 414-2, and gates 406 of various transistors 310, as well as first and second interconnects 330-1 and 330-2, and first and second platelines (PLs) 360-1 and 360-2. In FIGS. 4A-4B, gates 406, first S/D contacts 414-1, and second S/D contacts 414-2 are shown with different patterns and not labeled individually in order to not clutter the drawings with too many reference numerals, with a legend showing the correspondence between the reference numerals and patterns being provided within a dashed box at the bottom of these drawings. The gates 406 may either be conductive contacts to the gate stacks (e.g., the gate stacks 106/206) of the transistors 310 or may form parts of these gate stacks, while the S/D contacts 414 may be conductive contacts to the S/D regions (e.g., the S/D regions 114/214) of the transistors 310. The same applies to FIG. 6.

As shown in FIG. 4A, in some embodiments, each of the 2T memory cells 300 may be provided along a single elongated structure 404. In such embodiments, the first S/D terminals of the access transistor 310-1 and the storage transistor 310-2 may be coupled to one another by providing a single first S/D region (e.g., a single first S/D region 114/214) shared between the access transistor 310-1 and the storage transistor 310-2. As a result, a single first S/D contact 414-1 may be shared between access transistor 310-1 and the storage transistor 310-2 for each of the 2T memory cells 300 provided along a given elongated structure 404.

FIG. 4A further illustrates that, for the first 2T memory cell 300-1, the shared first S/D contact 414-1 may be coupled to the second S/D contacts 414-2 of the storage transistor 310-2 by providing an interconnect 330-1. A first end of the interconnect 330-1 may be in conductive contact with the shared first S/D contact 414-1 of the memory cell 300-1, while a second end of the interconnect 330-1 may be in conductive contact with the second S/D contact 414-2 of the storage transistor 310-2 of the memory cell 300-1. Similarly, for the second 2T memory cell 300-2, the shared first S/D contact 414-1 may be coupled to the second S/D contacts 414-2 of the storage transistor 310-2 by providing an interconnect 330-2. A first end of the interconnect 330-2 may be in conductive contact with the shared first S/D contact 414-1 of the memory cell 300-2, while a second end of the interconnect 330-2 may be in conductive contact with the second S/D contact 414-2 of the storage transistor 310-2 of the memory cell 300-2.

FIG. 4A also illustrates that, for the first 2T memory cell 300-1, the gate 406 of the storage transistor 310-2 by coupled to a first PL 360-1, e.g., by extending said gate 406 to make contact with the first PL 360-1. Similarly, for the second 2T memory cell 300-2, the gate 406 of the storage transistor 310-2 by coupled to a second PL 360-2, e.g., by extending said gate 406 to make contact with the second PL 360-2.

The IC device 400B is substantially similar to the IC device 400A except that, in the IC device 400B, access and storage transistors of a given one of the 2T memory cells 300 are provided along respective (i.e., different) elongated structures 404. For example, as shown in FIG. 4B, the access transistor 310-1 of the first 2T memory cell 300-1 may be provided along the second elongated structure 404-2 and the storage transistor 310-2 of the first 2T memory cell 300-1 may be provided along the first elongated structure 404-1. FIG. 4B further illustrates that this may be reversed for the second 2T memory cell 300-2 (i.e., the access transistor 310-1 of the second 2T memory cell 300-2 may be provided along the first elongated structure 404-1 and the storage transistor 310-2 of the second 2T memory cell 300-2 may be provided along the second elongated structure 404-2). However, in further embodiments, any of the access transistors 310-1 and any of the storage transistors 310-2 of any of the 2T memory cells 300 of the IC device 400B may be provided along any of a plurality of elongated structures 404.

Because transistors 310 of different 2T memory cells 300 are provided next to one another along a given elongated structure 404, the IC device 400B may further include an isolation structure 418 to provide electrical isolation between different 2T memory cells 300. In some embodiments, such an isolation structure 418 may, e.g., extend continuously across a plurality of elongated structures 404, as shown in FIG. 4B. In other embodiments, analogous electrical isolation may be provided as a plurality of individual isolation structures 418, e.g., as shown in FIG. 6. In various embodiments, the isolation structure 418 may include any kind of structure that disrupts potential current flow in the elongated structures 404, e.g., it may be a trench cutting through the one or more of the elongated structures 404, the trench at least partially filled with any of the insulator materials described herein.

In the IC device 400B, for a given 2T memory cell 300, the first S/D terminals of the access transistor 310-1 and the storage transistor 310-2 may be coupled to one another by providing respective first S/D regions (e.g., first S/D regions 114-1/214-1) in different ones of the elongated structures 404-1 and 404-2, and then by providing a single first S/D contact 414-1 that extends (i.e., is electrically continuous) between the elongated structures 404-1 and 404-2. As shown in FIG. 4B, for the first 2T memory cell 300-1, such a single first S/D contact 414-1 may have one portion coupled to (e.g., in conductive contacts with) the first S/D region of the access transistor 310-1 in the second elongated structure 404-2 and having another portion coupled to (e.g., in conductive contacts with) the first S/D region of the storage transistor 310-2 in the first elongated structure 404-1. For the second 2T memory cell 300-2, FIG. 4B illustrates that a single first S/D contact 414-1 may have one portion coupled to (e.g., in conductive contacts with) the first S/D region of the access transistor 310-1 in the first elongated structure 404-1 and having another portion coupled to (e.g., in conductive contacts with) the first S/D region of the storage transistor 310-2 in the second elongated structure 404-2.

The interconnects 330 and the PLs 360 shown in FIG. 4B are coupled to respective portions of the 2T memory cells 300-1 and 300-2 in the same manner as was described for FIG. 4A.

FIGS. 4A-4B illustrate the interconnects 330 and the PLs 360 being substantially aligned with the edges 403 of the support structure 402 (e.g., being substantially parallel to the edges 403-1 and 403-3 and substantially perpendicular to the edges 403-2 and 403-4) and being in the same plane as the gates 406 and the S/D contacts 414. However, in other embodiments of the IC devices 400, any of the interconnects 330 and the PLs 360 may be implemented as any combination of electrically conductive lines, possibly in combination with one or more vias, be provided in any plane of the IC devices 400 and be arranged in any direction with respect to the edges 403 of the IC device 400.

Turning to the details of the 2T memory cell 500 shown in FIG. 5, the first S/D terminal of the access transistor 310-1 is coupled to the gate terminal of the storage transistor 310-2, the second S/D terminal of the access transistor 310-1 is coupled to the BL 340, and the gate terminal of the access transistor 310-1 is coupled to the WL 350. As also shown in FIG. 5, the second S/D terminal of the storage transistor 310-2 is coupled to the first S/D terminal of the storage transistor 310-2, e.g., by means of an interconnect 330, both of which are coupled (e.g., directly connected) to the PL 360. Because the first S/D terminals of the transistors 310, as well as the second S/D terminal of the storage transistor 310-2, are all coupled together, they will have the same potential during operation of the 2T memory cell 500. The 2T memory cell 500 may then be operated by applying appropriate signals to the BL 340, the WL 350, and the PL 360 to store charge in the storage transistor 310-2 (i.e., to perform a write operation) or to sense the charge stored in the storage transistor 310-2 (i.e., to perform a read operation). For example, by applying a voltage equal to or greater than the threshold voltage to the gate terminal of the access transistor 310-1, current flow between the first and second S/D terminals of the access transistor 310-1 is enabled (i.e., the access transistor 310-1 may be turned on). Consequently, a charge may be stored in the storage transistor 310-2 based on voltages applied to the BL 340 and the PL 360, or a charge that was already stored in the storage transistor 310-2 may be read by sending the voltage on the BL 340 when a suitable voltage is applied to the PL 360.

FIG. 6 provides a top-down view of an example IC device 600 implementing 2T memory cells 500 of FIG. 5, in accordance with some embodiments. As described above, any of the 2T memory cells with source-drain coupling in one transistor may be implemented using angled transistors. FIG. 6 provides an illustration of this, showing that the elongated structures 404-1 and 404-2 are angled with respect to the edges 403 of the support structure 402 of the IC device 600 because their longitudinal axes 620 (shown in FIG. 6 as a dash-dotted arrow and being analogous to the longitudinal axes 120, 220, described above) is not at angles of either 0 degrees or 90 degrees with respect to the edges 403 of the support structure 402. As shown in FIG. 6, the longitudinal axis 620 may be at an angle 605 with respect to the y-axis of the example coordinate system shown, where the angle 605 may be between about 10 and 80 degrees. Thus, the transistors 310 implemented in the IC device 600 along the angled elongated structures 404 are angled transistors.

FIG. 6 illustrates the gates 406 as non-angled gates by having the gates 406 being at an angle of 90 degrees with respect to each of the edges 403-1 and 403-3 and being at an angle of 0 degrees with respect to each of the edges 403-2 and 403-4. As a result, the gates 406 are angled with respect to the direction of carrier transport of the transistors 310, as defined by the angled longitudinal axes 620 of the elongated structures 404. In other embodiments of the IC devices described herein, the gates 406 may be angled with respect to the edges 403, as long as they remain to be angled with respect to the direction of carrier transport of the transistors 310.

The IC device 600 is similar to the IC device 400B in that, in the IC device 600, access and storage transistors of a given one of the 2T memory cells 500 are provided along respective (i.e., different) elongated structures 404. For example, as shown in FIG. 6, the access transistor 310-1 of the first 2T memory cell 500-1 may be provided along the first elongated structure 404-1 and the storage transistor 310-2 of the first 2T memory cell 500-1 may be provided along the second elongated structure 404-2. FIG. 6 further illustrates that this is repeated for the second 2T memory cell 500-2 (i.e., the access transistor 310-1 of the second 2T memory cell 500-1 may also be provided along the first elongated structure 404-1 and the storage transistor 310-2 of the second 2T memory cell 500-2 may be provided along the second elongated structure 404-2). However, in further embodiments, any of the access transistors 310-1 and any of the storage transistors 310-2 of any of the 2T memory cells 500 of the IC device 600 may be provided along any of a plurality of elongated structures 404.

Because transistors 310 of different 2T memory cells 500 are provided next to one another along a given elongated structure 404, the IC device 600 may further include isolation structures 418-1 and 418-2 to provide electrical isolation between different 2T memory cells 500. In some embodiments, additional isolation structures 418 may be provided in the IC device 600, e.g., as shown with optional isolation structures 418-3 and 418-4.

In the IC device 600, for a given 2T memory cell 500, the first S/D terminal of the access transistor 310-1 and the gate terminal of the storage transistor 310-2 may be coupled to one another by aligning the first S/D contact 414-1 of the access transistor 310-1 and the gate 406 of the storage transistor 310-2 so that an electrical contact may be made, as is shown in FIG. 6. Since the S/D contacts 414 and the gates 406 may include electrically conductive materials, a single line of an electrically conductive material may be provided, with a first portion that serves as the first S/D contact 414-1 of the access transistor 310-1 and a second portion that serves as the gate 406 of the storage transistor 310-2.

The interconnects 330 shown in FIG. 6 are coupled to respective portions of the 2T memory cells 500-1 and 500-2 in the same manner as was described for FIG. 4A. FIG. 6 illustrates the interconnects 330 being substantially aligned with (i.e., parallel) the elongated structures 404 (e.g., being angled with respect to the edges 403) and being in the same plane as the gates 406 and the S/D contacts 414. However, in other embodiments of the IC devices 600, any of the interconnects 330 may be implemented as any combination of electrically conductive lines, possibly in combination with one or more vias, be provided in any plane of the IC devices 600 and be arranged in any direction with respect to the edges 403 of the IC device 600.

Although FIG. 6 illustrates the IC device 600 having angled elongated structures 404 and, consequently, angled transistors 310 of the 2T memory cells 500, in other embodiments, the elongated structures 404 and, consequently, the transistors 310 of the 2T memory cells 500 may be non-angled in accordance with descriptions provided herein. Similarly, although FIGS. 4A-4B illustrate the IC devices 400 having non-angled elongated structures 404 and, consequently, non-angled transistors 310 of the 2T memory cells 300, in other embodiments, the elongated structures 404 and, consequently, the transistors 310 of the 2T memory cells 300 may be angled in accordance with descriptions provided herein.

The top-down view of the IC devices 400/600 are intended to show relative arrangements of some of the components therein, and the IC devices 400/600, or portions thereof, may include other components that are not illustrated. For example, although not specifically illustrated in FIGS. 4 and 6, the IC devices 400/600 may include further 2T memory cells 300/500 implemented in, or based on, the elongated structures 404, and/or may include the BLs 340 and the WLs 350 coupled to various ones of the 2T memory cells 300/500 and arranged in any manner with respect to the edges 403 of the support structures 402. In another example, although not specifically illustrated in FIGS. 4 and 6, at least portions of the elongated structures 404 may be surrounded in an insulator material, such as any of the ILD materials described above.

Any of the 2T memory cells with source-drain coupling in one transistor and any of the circuits with such memory cells may be used to implement any suitable components. For example, in various embodiments, 2T memory cells with source-drain coupling in one transistor as described herein may be part of one or more of: a central processing unit, a memory device (e.g., a high-bandwidth memory device), a memory cell, a logic circuit, input/output circuitry, a field programmable gate array (FPGA) component such as an FPGA transceiver or an FPGA logic, a power delivery circuitry, an amplifier (e.g., a III-V amplifier), Peripheral Component Interconnect Express (PCIE) circuitry, Double Data Rate (DDR) transfer circuitry, a computing device (e.g., a wearable or a handheld computing device), etc.

The IC devices implementing 2T memory cells with source-drain coupling in one transistor disclosed herein may be included in any suitable electronic device. FIGS. 7-11 illustrate various examples of apparatuses that may include one or more of the IC devices implementing 2T memory cells with source-drain coupling in one transistor disclosed herein.

Figure 7:
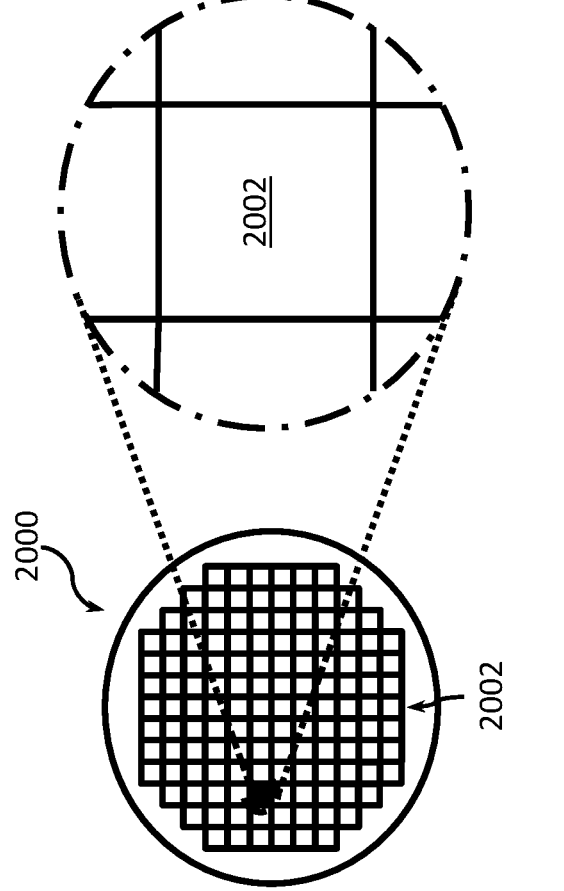
FIG. 7 provides top views of a wafer and dies that may include one or more IC devices implementing 2T memory cells with source-drain coupling in one transistor in accordance with any of the embodiments disclosed herein.

FIG. 7 illustrates top views of a wafer 2000 and dies 2002 that may include one or more IC devices implementing 2T memory cells with source-drain coupling in one transistor in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 8. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more IC devices implementing 2T memory cells with source-drain coupling in one transistor as described herein). After the fabrication of the semiconductor product is complete (e.g., after manufacture of any embodiment of the IC devices implementing 2T memory cells with source-drain coupling in one transistor as described herein), the wafer 2000 may undergo a singulation process in which each of the dies 2002 is separated from one another to provide discrete "chips" of the semiconductor product. In particular, devices that include one or more 2T memory cells with source-drain coupling in one transistor as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., a hysteretic memory device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. or other logic that is configured to store information in the memory devices or execute instructions stored in the memory array.

Figure 8:
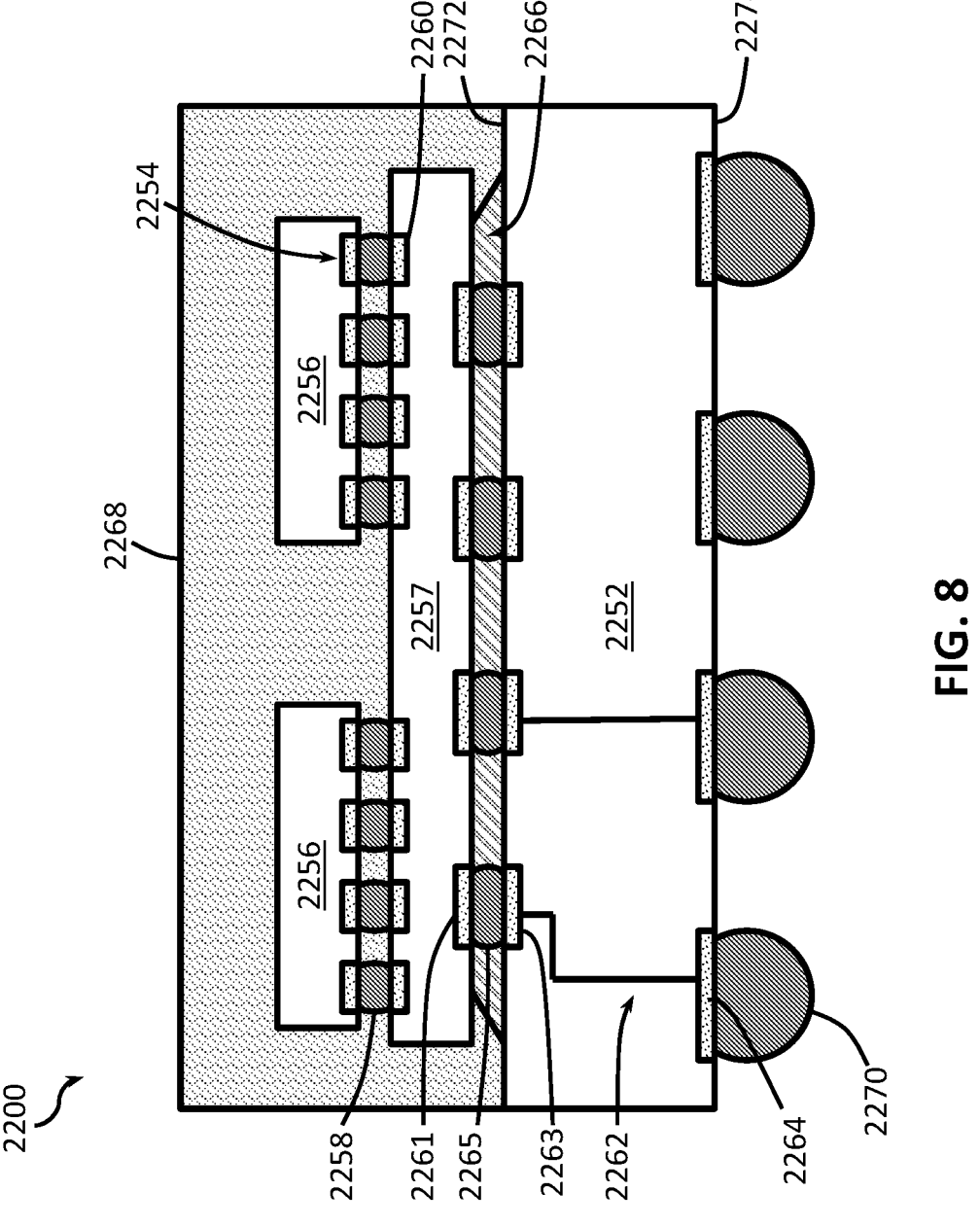
FIG. 8 is a cross-sectional side view of an IC package that may include one or more IC devices implementing 2T memory cells with source-drain coupling in one transistor in accordance with any of the embodiments disclosed herein.

FIG. 8 is a side, cross-sectional view of an example IC package 2200 that may include one or more IC devices implementing 2T memory cells with source-drain coupling in one transistor in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 8 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 8 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 8 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 9.

The dies 2256 may take the form of any of the embodiments of the die 2002 discussed herein (e.g., may include any of the embodiments of the IC devices implementing 2T memory cells with source-drain coupling in one transistor as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high-bandwidth memory), including embedded memory dies as described herein. In some embodiments, any of the dies 2256 may include one or more IC devices implementing 2T memory cells with source-drain coupling in one transistor, e.g., as discussed above; in some embodiments, at least some of the dies 2256 may not include any IC devices implementing 2T memory cells with source-drain coupling in one transistor.

The IC package 2200 illustrated in FIG. 8 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 8, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 9:
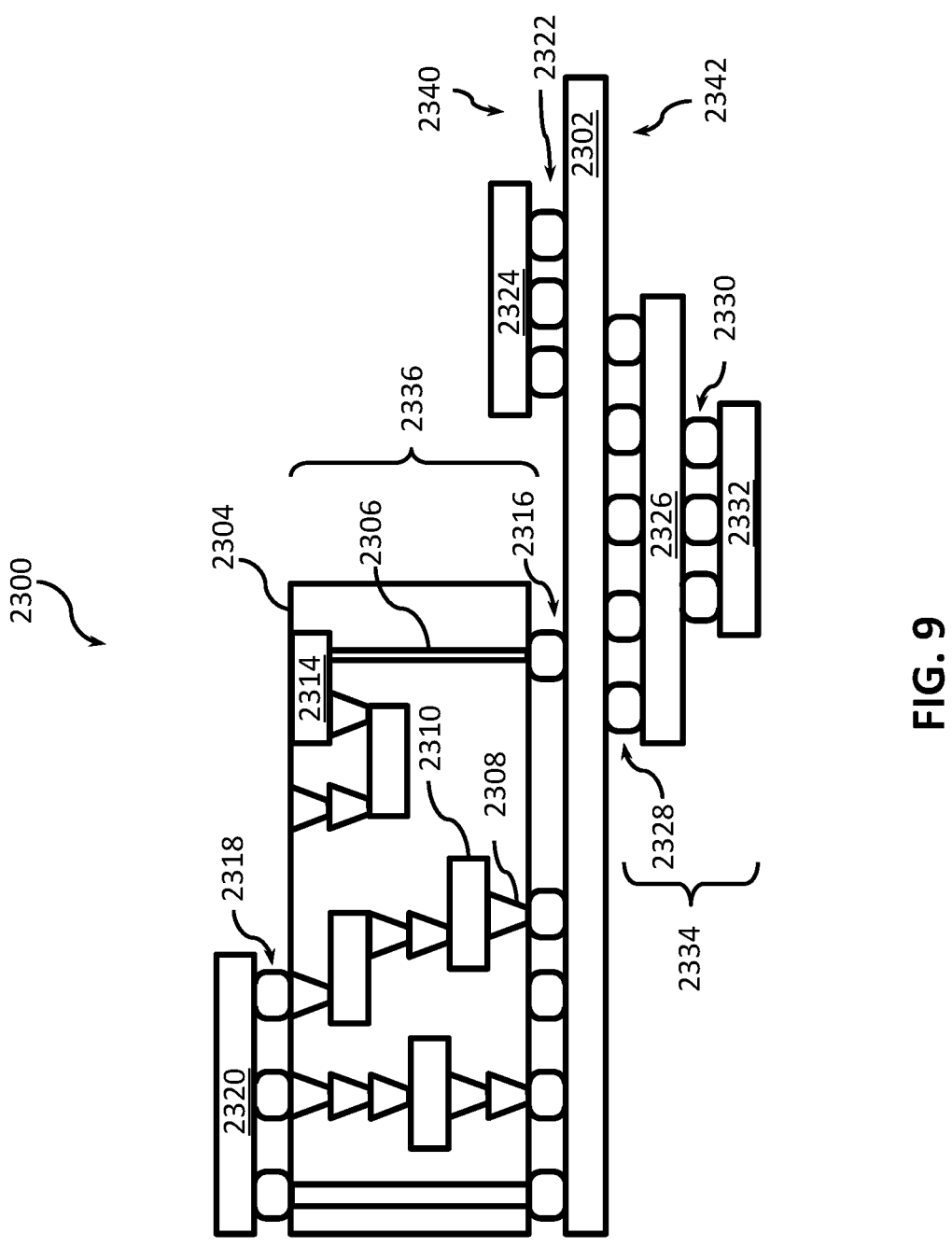
FIG. 9 is a cross-sectional side view of an IC device assembly that may include one or more IC devices implementing 2T memory cells with source-drain coupling in one transistor in accordance with any of the embodiments disclosed herein.

FIG. 9 is a cross-sectional side view of an IC device assembly 2300 that may include components having one or more IC devices implementing 2T memory cells with source-drain coupling in one transistor in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more IC devices implementing 2T memory cells with source-drain coupling in one transistor in accordance with any of the embodiments disclosed herein; e.g., any of the IC packages discussed below with reference to the IC device assembly 2300 may take the form of any of the embodiments of the IC package 2200 discussed above with reference to FIG. 8 (e.g., may include one or more IC devices implementing 2T memory cells with source-drain coupling in one transistor provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 9 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 9), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 7), an IC device, or any other suitable component. In particular, the IC package 2320 may include one or more IC devices implementing 2T memory cells with source-drain coupling in one transistor as described herein. Although a single IC package 2320 is shown in FIG. 9, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 9, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 9 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 10:
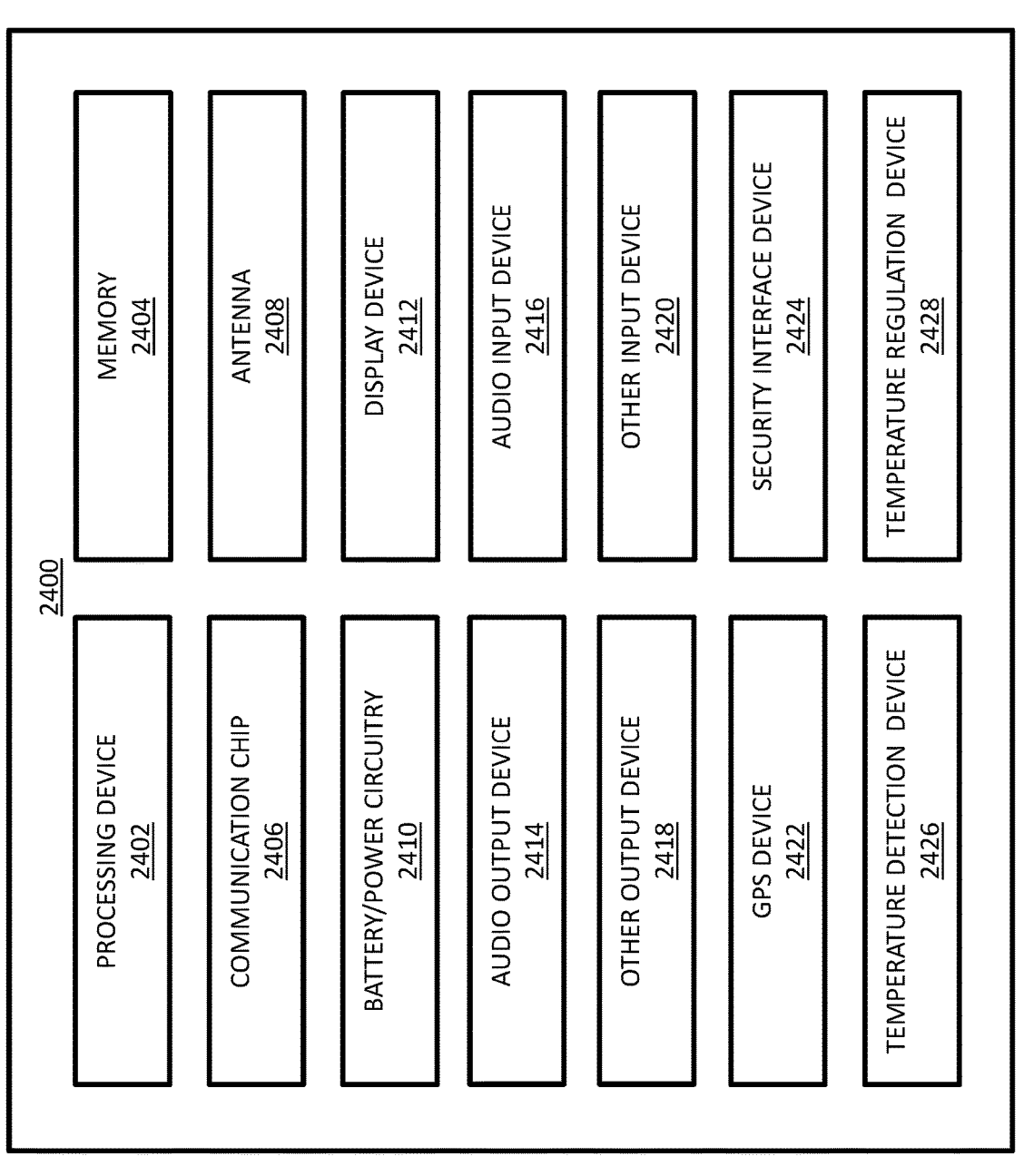
FIG. 10 is a block diagram of an example computing device that may include one or more IC devices implementing 2T memory cells with source-drain coupling in one transistor in accordance with any of the embodiments disclosed herein.

FIG. 10 is a block diagram of an example computing device 2400 that may include one or more components including one or more IC devices implementing 2T memory cells with source-drain coupling in one transistor in accordance with any of the embodiments disclosed herein. For example, any suitable ones of the components of the computing device 2400 may include a die (e.g., the die 2002 of FIG. 7) having one or more 2T memory cells with source-drain coupling in one transistor as described herein. Any one or more of the components of the computing device 2400 may include, or be included in, an IC package 2200 of FIG. 8 or an IC device 2300 of FIG. 9.

A number of components are illustrated in FIG. 10 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 10, but the computing device 2400 may include interface circuitry for coupling to the one or more components. For example, the computing device 2400 may not include a display device 2412, but may include display device interface circuitry (e.g., a connector and driver circuitry) to which a display device 2412 may be coupled. In another set of examples, the computing device 2400 may not include an audio input device 2416 or an audio output device 2414, but may include audio input or output device interface circuitry (e.g., connectors and supporting circuitry) to which an audio input device 2416 or audio output device 2414 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include embedded DRAM (eDRAM) or spin transfer torque MRAM.

In some embodiments, the computing device 2400 may include a communication chip 2406 (e.g., one or more communication chips). For example, the communication chip 2406 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2406 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 2406 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2406 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2406 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2406 may operate in accordance with other wireless protocols in other embodiments. The computing device 2400 may include an antenna 2408 to facilitate wireless communications and/or to receive other wireless communications (such as AM or FM radio transmissions).

In some embodiments, the communication chip 2406 may manage wired communications, such as electrical, optical, or any other suitable communication protocols (e.g., the Ethernet). As noted above, the communication chip 2406 may include multiple communication chips. For instance, a first communication chip 2406 may be dedicated to shorter-range wireless communications such as Wi-Fi or Bluetooth, and a second communication chip 2406 may be dedicated to longer-range wireless communications such as global positioning system (GPS), EDGE, GPRS, CDMA, WiMAX, LTE, EV-DO, or others. In some embodiments, a first communication chip 2406 may be dedicated to wireless communications, and a second communication chip 2406 may be dedicated to wired communications.

The computing device 2400 may include a battery/power circuitry 2410. The battery/power circuitry 2410 may include one or more energy storage devices (e.g., batteries or capacitors) and/or circuitry for coupling components of the computing device 2400 to an energy source separate from the computing device 2400 (e.g., AC line power).

The computing device 2400 may include a display device 2412 (or corresponding interface circuitry, as discussed above). The display device 2412 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2414 (or corresponding interface circuitry, as discussed above). The audio output device 2414 may include any device that generates an audible indicator, such as speakers, headsets, or earbuds, for example.

The computing device 2400 may include an audio input device 2416 (or corresponding interface circuitry, as discussed above). The audio input device 2416 may include any device that generates a signal representative of a sound, such as microphones, microphone arrays, or digital instruments (e.g., instruments having a musical instrument digital interface (MIDI) output).

The computing device 2400 may include an other output device 2418 (or corresponding interface circuitry, as discussed above). Examples of the other output device 2418 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may include a GPS device 2422 (or corresponding interface circuitry, as discussed above). The GPS device 2422 may be in communication with a satellite-based system and may receive a location of the computing device 2400, as known in the art.

The computing device 2400 may include a security interface device 2424. The security interface device 2424 may include any device that provides security features for the computing device 2400 or for any individual components therein (e.g., for the processing device 2402 or for the memory 2404). Examples of security features may include authorization, access to digital certificates, access to items in keychains, etc. Examples of the security interface device 2424 may include a software firewall, a hardware firewall, an antivirus, a content filtering device, or an intrusion detection device.

In some embodiments, the computing device 2400 may include a temperature detection device 2426 and a temperature regulation device 2428.

The temperature detection device 2426 may include any device capable of determining temperatures of the computing device 2400 or of any individual components therein (e.g., temperatures of the processing device 2402 or of the memory 2404). In various embodiments, the temperature detection device 2426 may be configured to determine temperatures of an object (e.g., the computing device 2400, components of the computing device 2400, devices coupled to the computing device, etc.), temperatures of an environment (e.g., a data center that includes, is controlled by, or otherwise associated with the computing device 2400), and so on. The temperature detection device 2426 may include one or more temperature sensors. Different temperature sensors of the temperature detection device 2426 may have different locations within and around the computing device 2400. A temperature sensor may generate data (e.g., digital data) representing detected temperatures and provide the data to another device, e.g., to the temperature regulation device 2428, the processing device 2402, the memory 2404, etc. In some embodiments, a temperature sensor of the temperature detection device 2426 may be turned on or off, e.g., by the processing device 2402 or an external system. The temperature sensor detects temperatures when it is on and does not detect temperatures when it is off. In other embodiments, a temperature sensor of the temperature detection device 2426 may detect temperatures continuously and automatically or detect temperatures at predefined times or at times triggered by an event associated with the computing device 2400 or any components therein.

The temperature regulation device 2428 may include any device configured to change (e.g., decrease) temperatures, e.g., based on one or more target temperatures and/or based on temperature measurements performed by the temperature detection device 2426. A target temperature may be a preferred temperature. A target temperature may depend on a setting in which the computing device 2400 operates. In some embodiments, the target temperature may be 200 Kelvin degrees or lower. In some embodiments, the target temperature may be 20 Kelvin degrees or lower, or 5 Kelvin degrees or lower. Target temperatures for different objects and different environments of, or associated with, the computing device 2400 can be different. In some embodiments, cooling provided by the temperature regulation device 2428 may be a multi-stage process with temperatures ranging from room temperature to 4K or lower.

In some embodiments, the temperature regulation device 2428 may include one or more cooling devices. Different cooling device may have different locations within and around the computing device 2400. A cooling device of the temperature regulation device 2428 may be associated with one or more temperature sensors of the temperature detection device 2426 and may be configured to operate based on temperatures detected the temperature sensors. For instance, a cooling device may be configured to determine whether a detected ambient temperature is above the target temperature or whether the detected ambient temperature is higher than the target temperature by a predetermined value or determine whether any other temperature-related condition associated with the temperature of the computing device 2400 is satisfied. In response to determining that one or more temperature-related condition associated with the temperature of the computing device 2400 are satisfied (e.g., in response to determining that the detected ambient temperature is above the target temperature), a cooling device may trigger its cooling mechanism and start to decrease the ambient temperature. Otherwise, the cooling device does not trigger any cooling. A cooling device of the temperature regulation device 2428 may operate with various cooling mechanisms, such as evaporation cooling, radiation cooling, conduction cooling, convection cooling, other cooling mechanisms, or any combination thereof. A cooling device of the temperature regulation device 2428 may include a cooling agent, such as a water, oil, liquid nitrogen, liquid helium, etc. In some embodiments, the temperature regulation device 2428 may be, for example, a dilution refrigerator, a helium-3 refrigerator, or a liquid helium refrigerator. In some embodiments, the temperature regulation device 2428 or any portions thereof (e.g., one or more of the individual cooling devices) may be connected to the computing device 2400 in close proximity (e.g., less than about 1 meter) or may be provided in a separate enclosure where a dedicated heat exchanger (e.g., a compressor, a heating, ventilation, and air conditioning (HVAC) system, liquid helium, liquid nitrogen, etc.) may reside.

By maintaining the target temperatures, the energy consumption of the computing device 2400 (or components thereof) can be reduced, while the computing efficiency may be improved. For example, when the computing device 2400 (or components thereof) operates at lower temperatures, energy dissipation (e.g., heat dissipation) may be reduced. Further, energy consumed by semiconductor components (e.g., energy needed for switching transistors of any of the components of the computing device 2400) can also be reduced. Various semiconductor materials may have lower resistivity and/or higher mobility at lower temperatures. That way, the electrical current per unit supply voltage may be increased by lowering temperatures. Conversely, for the same current that would be needed, the supply voltage may be lowered by lowering temperatures. As energy corelates to the supply voltage, the energy consumption of the semiconductor components may lower too. In some implementations, the energy savings due to reducing heat dissipation and reducing energy consumed by semiconductor components of the computing device or components thereof may outweigh (sometimes significantly outweigh) the costs associated with energy needed for cooling.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Figure 11:
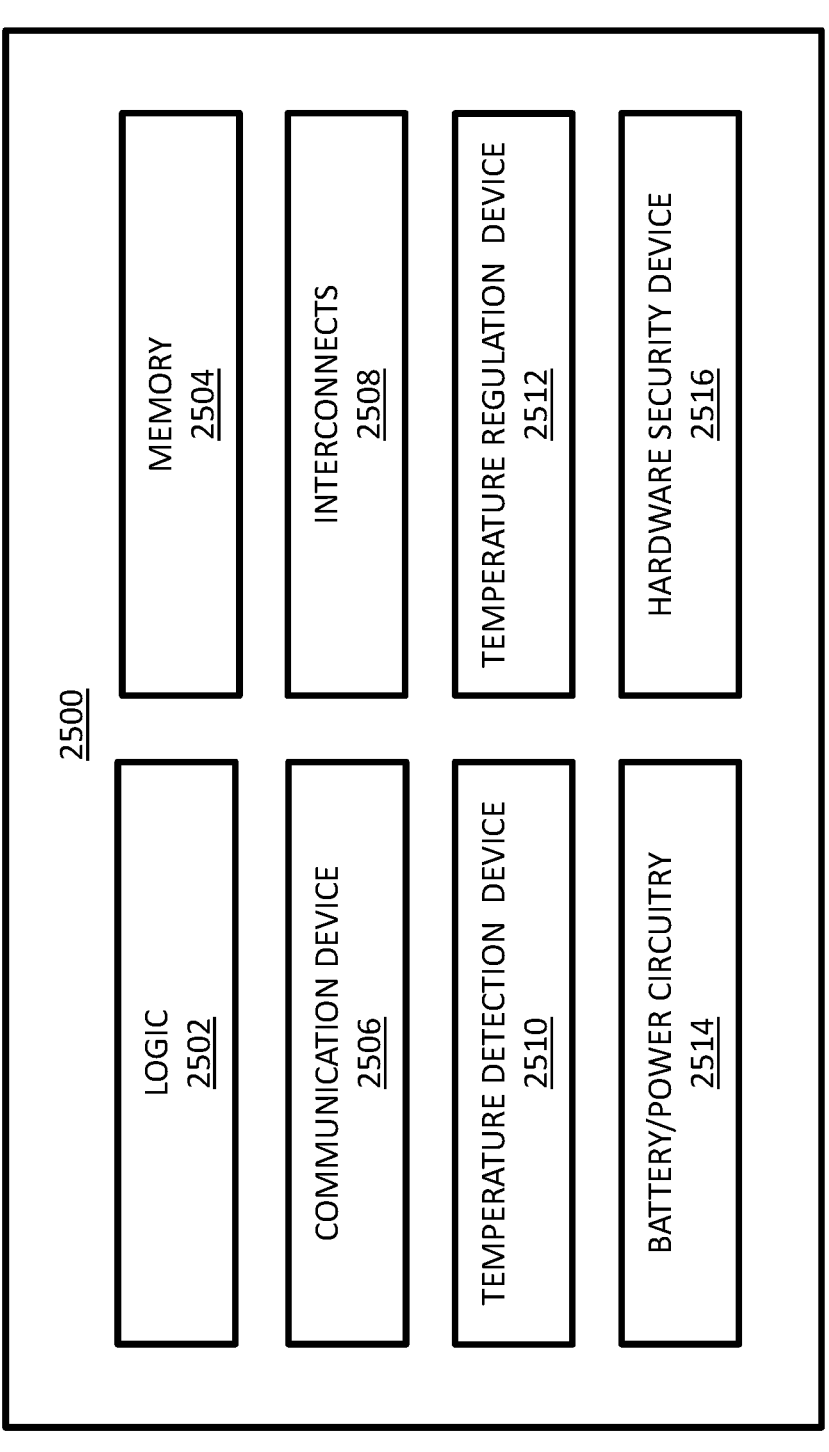
FIG. 11 is a block diagram of an example processing device that may include one or more IC devices implementing 2T memory cells with source-drain coupling in one transistor in accordance with any of the embodiments disclosed herein.

FIG. 11 is a block diagram of an example processing device 2500 that may include one or more IC devices implementing 2T memory cells with source-drain coupling in one transistor in accordance with any of the embodiments disclosed herein. For example, any suitable ones of the components of the processing device 2500 may include a die (e.g., the die 2002 of FIG. 7) having one or more 2T memory cells with source-drain coupling in one transistor as described herein. Any one or more of the components of the processing device 2500 may include, or be included in, an IC device 2300 (FIG. 9). Any one or more of the components of the processing device 2500 may include, or be included in, an IC package 2200 of FIG. 8 or an IC device 2300 of FIG. 9. Any one or more of the components of the processing device 2500 may include, or be included in, a computing device 2400 of FIG. 10; for example, the processing device 2500 may be the processing device 2402 of the computing device 2400.

A number of components are illustrated in FIG. 11 as included in the processing device 2500, but any one or more of these components may be omitted or duplicated, as suitable for the application. In some embodiments, some or all of the components included in the processing device 2500 may be attached to one or more motherboards. In some embodiments, some or all of these components are fabricated on a single SoC die or coupled to a single support structure, e.g., to a single carrier substrate.

Additionally, in various embodiments, the processing device 2500 may not include one or more of the components illustrated in FIG. 11, but the processing device 2500 may include interface circuitry for coupling to the one or more components. For example, the processing device 2500 may not include a memory 2504, but may include display device interface circuitry (e.g., a connector and driver circuitry) to which a memory 2504 may be coupled.

The processing device 2500 may include logic circuitry 2502 (e.g., one or more circuits configured to implement logic/compute functionality). Examples of such circuits include ICs implementing one or more of input/output (I/O) functions, arithmetic operations, pipelining of data, etc.

In some embodiments, the logic circuitry 2502 may include one or more circuits responsible for read/write operations with respect to the data stored in the memory 2504. To that end, the logic circuitry 2502 may include one or more I/O ICs configured to control access to data stored in the memory 2504.

In some embodiments, the logic circuitry 2502 may include one or more high-performance compute dies, configured to perform various operations with respect to data stored in the memory 2504 (e.g., arithmetic and logic operations, pipelining of data from one or more memory dies of the memory 2504, and possibly also data from external devices/chips). In some embodiments, the logic circuitry 2502 may be configured to only control I/O access to data but not perform any operations on the data. In some embodiments, the logic circuitry 2502 may implement ICs configured to implement I/O control of data stored in the memory 2504, assemble data from the memory 2504 for transport (e.g., transport over a central bus) to devices/chips that are either internal or external to the processing device 2500, etc. In some embodiments, the logic circuitry 2502 may not be configured to perform any operations on the data besides I/O and assembling for transport to the memory 2504.

The processing device 2500 may include a memory 2504, which may include one or more ICs configure to implement memory circuitry (e.g., ICs implementing one or more of memory devices, memory arrays, control logic configured to control the memory devices and arrays, etc.). In some embodiments, the memory 2504 may be implemented substantially as described above with reference to the memory 2404 (FIG. 10). In some embodiments, the memory 2504 may be a designated device configured to provide storage functionality for the components of the processing device 2500 (e.g., local), while the memory 1604 may be configured to provide system-level storage functionality for the entire computing device 2400 (e.g., global). In some embodiments, the memory 2504 may include memory that shares a die with the logic circuitry 2502.

In some embodiments, the memory 2504 may include a flat memory (also sometimes referred to as a "flat hierarchy memory" or a "linear memory") and, therefore, may also be referred to as a "basin memory." As known in the art, a flat memory or a linear memory refers to a memory addressing paradigm in which memory may appear to the program as a single contiguous address space, where a processor can directly and linearly address all of the available memory locations without having to resort to memory segmentation or paging schemes. Thus, the memory implemented in the memory 2504 may be a memory that is not divided into hierarchical layer or levels in terms of access of its data.

In some embodiments, the memory 2504 may include a hierarchical memory. In this context, hierarchical memory refers to the concept of computer architecture where computer storage is separated into a hierarchy based on features of memory such as response time, complexity, capacity, performance, and controlling technology. Designing for high performance may require considering the restrictions of the memory hierarchy, e.g., the size and capabilities of each component. With hierarchical memory, each of the various memory components can be viewed as part of a hierarchy of memories ($m_1$, $m_2$, . . . , $m_n$) in which each member $m_i$ is typically smaller and faster than the next highest member $m_{i+1}$ of the hierarchy. To limit waiting by higher levels, a lower level of a hierarchical memory structure may respond by filling a buffer and then signaling for activating the transfer. For example, in some embodiments, the hierarchical memory implemented in the memory 2504 may be separated into four major storage levels: 1) internal storage (e.g., processor registers and cache), 2) main memory (e.g., the system RAM and controller cards), and 3) on-line mass storage (e.g., secondary storage), and 4) off-line bulk storage (e.g., tertiary, and off-line storage). However, as the number of levels in the memory hierarchy and the performance at each level has increased over time and is likely to continue to increase in the future, this example hierarchical division provides only one non-limiting example of how the memory 2504 may be arranged.

The processing device 2500 may include a communication device 2506, which may be implemented substantially as described above with reference to the communication chip 2406 (FIG. 10). In some embodiments, the communication device 2506 may be a designated device configured to provide communication functionality for the components of the processing device 2500 (e.g., local), while the communication chip 2406 may be configured to provide system-level communication functionality for the entire computing device 2400 (e.g., global).

The processing device 2500 may include interconnects 2508, which may include any element or device that includes an electrically conductive material for providing electrical connectivity to one or more components of, or associated with, a processing device 2500 or/and between various such components. Examples of the interconnects 2508 include conductive lines/wires (also sometimes referred to as "lines" or "metal lines" or "trenches") and conductive vias (also sometimes referred to as "vias" or "metal vias"), metallization stacks, redistribution layers, metal-insulator-metal (MIM) structures, etc.

The processing device 2500 may include a temperature detection device 2510 which may be implemented substantially as described above with reference to the temperature detection device 2426 of FIG. 10 but configured to determine temperatures on a more local scale, e.g., of the processing device 2500 of components thereof. In some embodiments, the temperature detection device 2510 may be a designated device configured to provide temperature detection functionality for the components of the processing device 2500 (e.g., local), while the temperature detection device 2426 may be configured to provide system-level temperature detection functionality for the entire computing device 2400 (e.g., global).

The processing device 2500 may include a temperature regulation device 2512 which may be implemented substantially as described above with reference to the temperature regulation device 2428 of FIG. 10 but configured to regulate temperatures on a more local scale, e.g., of the processing device 2500 of components thereof. In some embodiments, the temperature regulation device 2512 may be a designated device configured to provide temperature regulation functionality for the components of the processing device 2500 (e.g., local), while the temperature regulation device 2428 may be configured to provide system-level temperature regulation functionality for the entire computing device 2400 (e.g., global).

The processing device 2500 may include a battery/power circuitry 2514 which may be implemented substantially as described above with reference to the battery/power circuitry 2410 of FIG. 10. In some embodiments, the battery/power circuitry 2514 may be a designated device configured to provide battery/power functionality for the components of the processing device 2500 (e.g., local), while the battery/power circuitry 2410 may be configured to provide system-level battery/power functionality for the entire computing device 2400 (e.g., global).

The processing device 2500 may include a hardware security device 2516 which may be implemented substantially as described above with reference to the security interface device 2424 of FIG. 10. In some embodiments, the hardware security device 2516 may be a physical computing device configured to safeguard and manage digital keys, perform encryption and decryption functions for digital signatures, authentication, and other cryptographic functions. In some embodiments, the hardware security device 2516 may include one or more secure cryptoprocessors chips.

The above description of illustrated implementations of the disclosure, including what is described in the Abstract, is not intended to be exhaustive or to limit the disclosure to the precise forms disclosed. Unless specified otherwise, in various embodiments, features described with respect to one of the drawings may be combined with those described with respect to other drawings.

The following paragraphs provide various examples of the embodiments disclosed herein.

Example 1 provides an IC device that includes a memory cell including a first transistor and a second transistor, each of the first and second transistors including a gate, a first source or drain (S/D) region, and a second S/D region, where one of the first S/D region and the second S/D region is a source region and another one is a drain region, where the first S/D region of the second transistor is coupled with the second S/D region of the second transistor (e.g., directly connected), and the first S/D region of the first transistor is coupled with either the first S/D region of the second transistor or the gate of the second transistor.

Example 2 provides the IC device according to example 1, where the second S/D region of the first transistor is coupled to a first memory control line (e.g., a BL).

Example 3 provides the IC device according to any one of examples 1-2, where the gate of the first transistor is coupled to a second memory control line (e.g., a WL).

Example 4 provides the IC device according to any one of examples 1-3, where the second transistor is coupled to a third memory control line (e.g., a PL).

Example 5 provides the IC device according to any one of examples 1-4, where the first S/D region of the first transistor is coupled with the first S/D region of the second transistor, and the gate of the second transistor is coupled to a third memory control line (e.g., a PL).

Example 6 provides the IC device according to any one of examples 1-4, where the first S/D region of the first transistor is coupled with the first S/D region of the second transistor, and the first S/D region of the first transistor and the first S/D region of the second transistor is a single shared region.

Example 7 provides the IC device according to any one of examples 1-4, where the first S/D region of the first transistor is coupled with the gate of the second transistor, and the first S/D region of the second transistor is coupled to a third memory control line (e.g., a PL).

Example 8 provides the IC device according to any one of examples 1-7, further including an interconnect having a first portion in electrically conductive contact with the first S/D region of the second transistor and having a second portion in electrically conductive contact with the second S/D region of the second transistor.

Example 9 provides the IC device according to any one of examples 1-8, where a channel of the first transistor and a channel of the second transistor are in different portions of a single elongated structure.

Example 10 provides the IC device according to example 9, further including a support structure (e.g., a die, a substrate, a carrier substrate, etc.), where the memory cell is provided over the support structure, and an angle between an edge (e.g., one of edges) of the support structure and a projection of the elongated structure onto a plane of the support structure is between about 10 degrees and 80 degrees (e.g., the elongated structure is angled with respect to one edge of the support structure).

Example 11 provides the IC device according to example 10, where a projection, onto the plane of the support structure, of at least one of memory control lines coupled to the memory cell is substantially parallel to the projection of the elongated structure onto the plane of the support structure.

Example 12 provides the IC device according to any one of examples 10-11, where a projection, onto the plane of the support structure, of an interconnect coupling the first S/D region of the second transistor and the second S/D region of the second transistor is substantially parallel to the projection of the elongated structure onto the plane of the support structure.

Example 13 provides the IC device according to any one of examples 1-8, where a channel of the first transistor is in a first elongated structure, and a channel of the second transistor is in a second elongated structure.

Example 14 provides the IC device according to example 13, further including a support structure (e.g., a die, a substrate, a carrier substrate, etc.), where the memory cell is provided over the support structure, and an angle between an edge (e.g., one of edges) of the support structure and at least one of a projection of the first elongated structure onto a plane of the support structure and a projection of the second elongated structure onto the plane of the support structure is between about 10 degrees and 80 degrees (e.g., at least one of the first and second elongated structures is angled with respect to one edge of the support structure).

Example 15 provides the IC device according to example 14, where an angle between the edge (e.g., one of edges) of the support structure and a projection, onto the plane of the support structure, of at least one of memory control lines coupled to the memory cell is between about 10 degrees and 80 degrees.

Example 16 provides the IC device according to any one of examples 14-15, where an angle between the edge (e.g., one of edges) of the support structure and a projection, onto the plane of the support structure, of an interconnect coupling the first S/D region of the second transistor and the second S/D region of the second transistor is between about 10 degrees and 80 degrees.

Example 17 provides an IC device that includes a support structure (e.g., a die, a substrate, a carrier substrate, etc.); one or more elongated structures (e.g., one or more fins or nanoribbons) over the support structure; a first transistor having a channel region in a first portion of the one or more elongated structures; a second transistor having a channel region in a second portion of the one or more elongated structures; and an interconnect to connect a source region of the second transistor and a drain region of the second transistor, where an angle between an edge (i.e., one of edges) of the support structure and a projection of an individual elongated structure of the one or more elongated structures is between about 10 degrees and 80 degrees (i.e., the individual elongated structures are angled with respect to one edge of the support structure), and where a source region of the first transistor or a drain region of the first transistor is connected to at least one of the source region of the second transistor, the drain region of the second transistor, and a gate of the second transistor.

Example 18 provides the IC device according to example 17, where an angle between the edge of the support structure and a projection of the gate of the second transistor is either about 0 degrees or about 90 degrees.

Example 19 provides an IC device that includes a memory cell including a first transistor and a second transistor, where one of a source region of the first transistor and a drain region of the first transistor is connected to one of a source region of the second transistor, a drain region of the second transistor, or a gate of the second transistor, and where the source region of the second transistor is connected to the drain region of the second transistor; a first memory control line, connected to another one of the source region of the first transistor and the drain region of the first transistor; a second memory control line, connected to a gate of the first transistor; and a third memory control line, connected to the gate of the second transistor when the one of the source region of the first transistor and the drain region of the first transistor is connected to the source region of the second transistor or the drain region of the second transistor, and/or the source region of the second transistor or the drain region of the second transistor when the one of the source region of the first transistor and the drain region of the first transistor is connected to the gate of the second transistor.

Example 20 provides the IC device according to example 19, where the first memory control line is a bitline and the second memory control line is a wordline of a memory array.

Example 21 provides the IC device according to any one of the preceding examples, where the IC device includes or is a part of a central processing unit.

Example 22 provides the IC device according to any one of the preceding examples, where the IC device includes or is a part of a memory device, e.g., a high-bandwidth memory device.

Example 23 provides the IC device according to any one of the preceding examples, where the IC device further includes a plurality of memory cells, each of the memory cells including a storage element.

Example 24 provides the IC device according to example 23, where the storage element is one of a capacitor, a magnetoresistive material, a ferroelectric material, or a resistance-changing material.

Example 25 provides the IC device according to any one of the preceding examples, where the IC device includes or is a part of a logic circuit.

Example 26 provides the IC device according to any one of the preceding examples, where the IC device includes or is a part of input/output circuitry.

Example 27 provides the IC device according to any one of the preceding examples, where the IC device includes or is a part of an FPGA transceiver.

Example 28 provides the IC device according to any one of the preceding examples, where the IC device includes or is a part of an FPGA logic.

Example 29 provides the IC device according to any one of the preceding examples, where the IC device includes or is a part of a power delivery circuitry.

Example 30 provides the IC device according to any one of the preceding examples, where the IC device includes or is a part of a III-V amplifier.

Example 31 provides the IC device according to any one of the preceding examples, where the IC device includes or is a part of PCIE circuitry or DDR transfer circuitry.

Example 32 provides an IC package that includes a die comprising an IC device according to any one of the preceding examples; and a further IC component, coupled to the die.

Example 33 provides the IC package according to example 32, where the further IC component includes one of a package substrate, an interposer, or a further IC support structure.

Example 34 provides a computing device that includes a carrier substrate and an IC device, coupled to the carrier substrate, where the IC device is an IC device according to any one of the preceding examples, or the IC device is included in the IC package according to any one of examples 32-33.

Example 35 provides the computing device according to example 34, where the computing device is a wearable or handheld computing device.

Example 36 provides the computing device according to examples 34 or 35, where the computing device further includes one or more communication chips and an antenna.

Example 37 provides the computing device according to any one of examples 34-36, where the carrier substrate is a motherboard.

Example 38 provides a method of manufacturing an IC device, the method including providing the IC device according to any one of the preceding examples.

The invention claimed is:

1. An integrated circuit (IC) device, comprising:
   a substrate; and
   a memory cell over the substrate, the memory cell comprising a first transistor and a second transistor, wherein an individual one of the first and second transistors includes a gate, a first source or drain (S/D) region, and a second S/D region,
   wherein:
      one of the first S/D region and the second S/D region is a source region and another one is a drain region,
      the first S/D region of the second transistor is coupled with the second S/D region of the second transistor,
      the first S/D region of the first transistor is coupled with either the first S/D region of the second transistor or the gate of the second transistor,
      a channel of the first transistor and a channel of the second transistor are in different portions of an elongated structure, and
      an angle between an edge of the substrate and a projection of the elongated structure onto the substrate is between about 10 degrees and 80 degrees.

2. The IC device according to claim 1, wherein the second S/D region of the first transistor is coupled to a conductive line.

3. The IC device according to claim 1, wherein the gate of the first transistor is coupled to a conductive line.

4. The IC device according to claim 1, wherein the second transistor is coupled to a conductive line.

5. The IC device according to claim 1, wherein:

the first S/D region of the first transistor is coupled with the first S/D region of the second transistor, and the gate of the second transistor is coupled to a conductive line.

6. The IC device according to claim 1, wherein:

the first S/D region of the first transistor is coupled with the first S/D region of the second transistor, and the first S/D region of the first transistor and the first S/D region of the second transistor is a single shared region.

7. The IC device according to claim 1, wherein:

the first S/D region of the first transistor is coupled with the gate of the second transistor, and the first S/D region of the second transistor is coupled to a conductive line.

8. The IC device according to claim 1, further comprising an interconnect having a first portion in conductive contact with the first S/D region of the second transistor and having a second portion in conductive contact with the second S/D region of the second transistor.

9. The IC device according to claim 1, wherein a projection, onto the substrate, of at least one of conductive lines coupled to the memory cell is substantially parallel to the projection of the elongated structure.

10. The IC device according to claim 1, wherein a projection, onto the substrate, of an interconnect coupling the first S/D region of the second transistor and the second S/D region of the second transistor is substantially parallel to the projection of the elongated structure.

11. The IC device according to claim 1, further comprising:

a first IC component, wherein the first component includes the substrate and the memory cell; and a second IC component coupled to the first IC component, wherein the second IC component includes one of a package substrate, an interposer, or a die.

12. The IC device according to claim 1, wherein the elongated structure is a fin or a nanoribbon.

13. An integrated circuit (IC) device, comprising:

a base;

one or more elongated structures over the base;

a first transistor having a channel region in a first portion of the one or more elongated structures;

a second transistor having a channel region in a second portion of the one or more elongated structures; and an interconnect connected to a source region of the second transistor and a drain region of the second transistor, wherein:

an angle between an edge of the base and a projection of an individual elongated structure of the one or more elongated structures is between about 10 degrees and 80 degrees, and a source region of the first transistor or a drain region of the first transistor is connected to at least one of the source region of the second transistor, the drain region of the second transistor, and a gate of the second transistor.

14. The IC device according to claim 13, wherein an angle between the edge of the base and a projection of the gate of the second transistor is either about 0 degrees or about 90 degrees.

15. The IC device according to claim 13, further comprising:

a first IC component, wherein the first component includes the base, the one or more elongated structures, the first transistor, the second transistor, and the interconnect; and a second IC component coupled to the first IC component, wherein the second IC component includes one of a package substrate, an interposer, or a die.

16. An integrated circuit (IC) device, comprising:

a substrate; and a memory cell over the substrate, the memory cell comprising a first transistor and a second transistor, wherein an individual one of the first and second transistors includes a gate, a first source or drain (S/D) region, and a second S/D region, wherein:

one of the first S/D region and the second S/D region is a source region and another one is a drain region, the first S/D region of the second transistor is coupled with the second S/D region of the second transistor, the first S/D region of the first transistor is coupled with either the first S/D region of the second transistor or the gate of the second transistor, a channel of the first transistor is in a first elongated structure, a channel of the second transistor is in a second elongated structure, and an angle between an edge of the substrate and at least one of a projection of the first elongated structure onto the substrate and a projection of the second elongated structure onto the substrate is between about 10 degrees and 80 degrees.

17. The IC device according to claim 16, wherein an angle between the edge of the substrate and a projection, onto the substrate, of at least one of memory control lines coupled to the memory cell is between about 10 degrees and 80 degrees.

18. The IC device according to claim 16, wherein an angle between the edge of the substrate and a projection, onto the substrate, of an interconnect coupling the first S/D region of the second transistor and the second S/D region of the second transistor is between about 10 degrees and 80 degrees.

19. The IC device according to claim 16, further comprising:

a first IC component, wherein the first component includes the substrate and the memory cell; and a second IC component coupled to the first IC component, wherein the second IC component includes one of a package substrate, an interposer, or a die.

20. The IC device according to claim 16, wherein the first elongated structure is a fin or a nanoribbon.

* * * * *